US007336538B2

(12) United States Patent
Crippa et al.

(10) Patent No.: US 7,336,538 B2
(45) Date of Patent: Feb. 26, 2008

(54) PAGE BUFFER CIRCUIT AND METHOD FOR MULTI-LEVEL NAND PROGRAMMABLE MEMORIES

(75) Inventors: Luca Crippa, Busnago (IT); Chiara Missiroli, Concorezzo (IT); Roberto Ravasio, Ponte San Pietro (IT); Rino Micheloni, Turate (IT); Angelo Bovino, Brunico (IT)

(73) Assignee: STMicroelectronics S.r.l., Agrate Brianza (MI) (IT)

( * ) Notice: Subject to any disclaimer, the term of this patent is extended or adjusted under 35 U.S.C. 154(b) by 0 days.

(21) Appl. No.: 11/495,874

(22) Filed: Jul. 28, 2006

(65) Prior Publication Data
US 2007/0030735 A1 Feb. 8, 2007

(30) Foreign Application Priority Data
Jul. 28, 2005 (EP) .................................. 05106972

(51) Int. Cl.
*G11C 16/04* (2006.01)
(52) U.S. Cl. .......................... 365/185.12; 365/185.03; 365/185.22
(58) Field of Classification Search ........... 365/185.03, 365/185.12, 185.22, 185.28, 185.17
See application file for complete search history.

(56) References Cited

U.S. PATENT DOCUMENTS 5,864,503 A 1/1999 Pascucci et al.

(Continued)

FOREIGN PATENT DOCUMENTS

| EP | 1 164 597 A | 12/2001 |
|----|-------------|---------|
| EP | 1 288 964 A | 3/2003 |

OTHER PUBLICATIONS

Seungjae Lee et al., "2.7—A 3.3V 4Gb Four-Level NAND Flash Meory with 90nm CMOS Technology", Solid-State Circuits Converence, 2004, Digest of Technical Papers, ISSCC. 2004 IEEE International San Francisco, CA, USA Feb. 15-19, 2004, Piscataway, NJ, USA, IEEE, Feb. 15, 2004, pp. 52-61.

(Continued)

*Primary Examiner*—Gene Auduong
(74) *Attorney, Agent, or Firm*—Graybeal Jackson Haley LLP

(57) ABSTRACT

A page buffer for an electrically programmable memory including at least one read/program unit having a coupling line operatively associable with at least one of said bit lines and adapted to at least temporarily storing data bits read from or to be written into either one of the first or second memory page stored in the memory cells of a selected memory cell sets. The read/program unit includes enabling means for selectively enabling a change in programming state of a selected memory cell by causing the coupling line to take one among a program enabling potential and a program inhibition potential, conditioned to a target data value to be stored in the first group of data bits of the selected memory cell and an existing data value already stored in the second group of data bits of the selected memory cell. The enabling means includes reading means for retrieving the existing data value, means for receiving an indication of the target data value, combining means for combining the received target data value with the retrieved existing data value, thereby modifying said indication of the target data value so as to obtain a modified indication. Conditioning means in the combining means condition a potential of the coupling line based on the existing data value and the modified indication so as to cause the coupling line to take the program enabling potential or the program inhibition potential.

22 Claims, 14 Drawing Sheets

U.S. PATENT DOCUMENTS

| | | | |
|---|---|---|---|
| 5,933,366 | A | 8/1999 | Yoshikawa et al. |
| 6,058,042 | A | 5/2000 | Nobukata et al. |
| 6,128,229 | A | 10/2000 | Nobukata et al. |
| 6,243,290 | B1 | 6/2001 | Kurata et al. |
| 6,304,486 | B1 | 10/2001 | Yano |
| 6,307,785 | B1 | 10/2001 | Takeuchi et al. |
| 6,483,744 | B2 * | 11/2002 | Kim et al. ............. 365/185.03 |
| 6,496,412 | B1 * | 12/2002 | Shibata et al. ......... 365/185.03 |
| 6,545,909 | B2 | 4/2003 | Tanaka et al. |
| 2002/0126531 | A1 | 9/2002 | Hosono et al. |
| 2003/0156478 | A1 | 8/2003 | Maruyama et al. |
| 2004/0109362 | A1 | 6/2004 | Gongwer et al. |
| 2004/0190337 | A1 | 9/2004 | Chen |
| 2005/0018488 | A1 | 1/2005 | Dong-Hwan et al. |
| 2007/0030730 | A1 * | 2/2007 | Bovino et al. ........... 365/185.2 |
| 2007/0030732 | A1 * | 2/2007 | Micheloni et al. ..... 365/185.03 |

OTHER PUBLICATIONS

Ken Takeuchi, et al., "A Multipage Cell Architecture for High-Speed Programming Multilevel NAND Flash Memories", IEEE Journal of Solid-State Circuits, vol. 33, No. 8, Aug. 1998, pp. 1228-1238.

Atsushi Nozoe, et al., "A 256-Mb Multilevel Flash Memory with 2-MB/s Program Rate for Mass Storage Applications", IEEE Journal of Solid-State Circuits, vol. 34, No. 11, Nov. 1999, pp. 1544-1550.

Tae-Sung Jung, et al., "A 117-mm2 3.3-V Only 128-MB Multilevel NAND Flash Memory for Mass Storage Applications", IEEE Journal of Solid-State Circuits, vol. 31, No. 11. Nov. 1996, pp. 1575-1583.

European Search Report for EP 05 10 6972 dated Jan. 18, 2006.
European Search Report for EP 05 10 6976 dated Jan. 16, 2006.
European Search Report for EP 05 10 6975 dated Jan. 26, 2006.

* cited by examiner

PAGE BUFFER CIRCUIT AND METHOD FOR MULTI-LEVEL NAND PROGRAMMABLE MEMORIES

CROSS REFERENCE TO RELATED APPLICATIONS

This application is related to U.S. patent application Ser. No. 11/495,886 entitled NAND FLASH MEMORY WITH ERASE VERIFY BASED ON SHORTER EVALUATION TIME, and Ser. No. 11/495,876 entitled DOUBLE PAGE PROGRAMMING SYSTEM AND METHOD, which have a common filing date and owner and which are incorporated by reference.

PRIORITY CLAIM

This application claims priority from European patent application Nos. EP05106972.2, filed Jul. 28, 2005, EP05106976.3, filed Jul. 28, 2005, and EP05106975.5, filed Jul. 28, 2005, which are incorporated herein by reference.

TECHNICAL FIELD

Embodiments of the present invention generally relate to the field of solid-state memories, particularly to semiconductor memories and, even more particularly, to the field of non-volatile memories. Specifically, embodiments of the invention relate to non-volatile memories that are electrically programmable.

BACKGROUND

Non-volatile memories are commonly used in several applications when the data stored in the memory device need to be preserved even in absence of power supply. Within the class of non-volatile memories, electrically programmable (and erasable) memories, such as flash memories, have become very popular in applications in which the data to be stored are not immutable (as it might be case of, e.g., a consolidated code for a microprocessor), being instead necessary from time to time to store new data, or to update the data already stored.

Typically, the memory device includes an arrangement of memory cells, disposed for example in rows and columns, so as to form a matrix.

Depending on the way the memory cells in the matrix are interconnected, two classes of flash memories can be identified: those having a so-called NOR architecture, or NOR flash memories, and those having a so-called NAND architecture, shortly referred to as NAND flash memories. Roughly speaking, in a NOR architecture the memory cells of a same matrix column are connected in parallel to a same bit line, whereas in a NAND architecture groups of memory cells of a same matrix column are serially interconnected so as to form respective strings, which strings are then connected in parallel to each other to a same bit line.

Compared to NOR flash memories, NAND flash memories are more compact (a lower number of contacts in the matrix are required), and they are also better suited for applications such as file storage.

In the NAND architecture, the memory space is ideally partitioned into a plurality of memory pages, each page corresponding to a block of memory cells that, in operation, are read or written simultaneously, i.e. in parallel to each other. The number of memory cells in each block determines the size (i.e., the number of bits) of the memory page. Nowadays, memory pages of 8192 cells are rather typical, but larger memory pages are also encountered, for example of 16384 cells.

Clearly, the memory cannot have so high a number of Input/Output (I/O) terminals as to enable transferring in parallel such long data words; usually, eight or sixteen I/O terminals are in fact provided; thus, some kind of "segmentation" of the memory page is necessary for interfacing the memory with the outside world.

To this purpose, a circuit arrangement called a "page buffer" is provided in the memory for managing the operations of reading the information stored in the memory cells of a selected memory page, or writing new information thereinto. In very general terms, the page buffer includes a buffer register of size equal to that of the memory page, wherein data read (in parallel) from the memory cells of a selected page are temporarily stored, before being serially outputted in chunks of, e.g., eight or sixteen bits, depending on the number of I/O terminals of the memory. Similarly, when data are to be written into the memory, the page buffer is replenished with data received serially in such eight- or sixteen-bits chunks, and, when the buffer has eventually been filled, the data are written in parallel into the memory cells of a given, selected memory page.

The page buffer includes a relatively high number of volatile storage elements, typically bistable elements or latches, in a number corresponding to the number of memory cells of the memory page.

The basic operations that usually are performed on the memory cells are a "page read" (an operation involving reading data from a selected memory page), a "page program" (writing data into a selected memory page), and an "erase" operation, wherein the storing of the memory cells is erased.

So-called "multilevel" memory devices are known, in which each memory cell is capable of storing more than one bit of information. More particularly, referring to the case of memory devices capable of storing a pair of bits of information per memory cell, the latter can be programmed in any one of four different programming states, each one associated with a corresponding logic value of the bit pair. Usually, the programming state of a memory cell is defined by the threshold voltage value of a transistor included in the memory cell; in a memory cell adapted to store two bits, the threshold voltage values of the memory cells may assume one of four different values (or ranges of values). A typical choice is to associate the logic values of the stored bit pair to the states according to a binary sequence "11", "10", "01", "00" corresponding to increasing threshold voltage values, with the logic value "11" that is associated to the state having the lowest threshold voltage value (erased state), and the others associated in succession to states having increasing threshold voltage values. Naturally, for writing data into a two-bit memory cell, or for reading data therefrom, it might be necessary to perform up to three read accesses to the memory cells, using different references.

A solution known in the art for reducing the number of read accesses necessary to retrieve the stored data consists of using a different association rule between logic values and states, that make use of the so called "Gray code." In this way, the logic values are associated to the states according to the binary sequence "11", "10", "00", "01", with the logic value "11" that is associated to the erased state, and the others that are associated in succession to states having increasing threshold voltage values. The main feature of using the Gray code consists in the fact that "adjacent" programming states (in terms of threshold voltage values)

have corresponding logic values that differ from each other by only one bit. This feature implies a series of advantages.

Page buffers using the Gray code that are known in the art are disclosed for example in the U.S. Pat. No. 6,545,909 and in the United States Patent Application 2002/0126531, both of which are hereby incorporated herein by reference.

In view of the state of the art outlined in the foregoing, the Applicant has faced the problem of how to improve the known solution for implementing a page buffer adapted to manage the operations necessary to the functioning of a multi-level NAND flash memory.

SUMMARY

According to an embodiment of the present invention, a page buffer for an electrically programmable memory includes a plurality of memory cells arranged in a plurality of bit lines of memory cells and forming a plurality of individually-selectable memory sets. The electrically programmable memory further includes a plurality of distinct programming states defined for each memory cell, corresponding to a number N>=2 of data bits storable in each memory cell. The data bits include at least a first data bits group and a second data bits group, the first data bits groups and, respectively, the second data bits groups stored in the memory cells of one of the individually-selectable memory cell sets forming at least a first memory page and a second memory page, respectively. The first and second memory pages are individually addressable in reading and writing.

The page buffer comprises at least one read/program unit having a coupling line operatively associable with at least one of the bit lines and adapted to at least temporarily storing data bits read from or to be written into either one of the first or second memory page stored in the memory cells of a selected memory cell sets. The read/program unit comprises enabling means for selectively enabling a change in programming state of a selected memory cell by causing the coupling line to take one among a program enabling potential and a program inhibition potential, conditioned to a target data value to be stored in the first group of data bits of the selected memory cell, and an existing data value already stored in the second group of data bits (LSB) of the selected memory cell.

The enabling means comprise reading means for retrieving the existing data value; means for receiving an indication of the target data value; combining means for combining the received target data value with the retrieved existing data value, thereby modifying said indication of the target data value so as to obtain a modified indication; and conditioning means included in the combining means for conditioning a potential of the coupling line based on the existing data value and the modified indication, so as to cause the coupling line to take the program enabling potential or the program inhibition potential.

Characterizing features of the present invention are set forth in the appended claims. Embodimnets of the invention itself, however, as well as further features and advantages thereof will be best understood by reference to the following detailed description, given purely by way of a non-restrictive indication, to be read in conjunction with the accompanying drawins.

DETAILED DESCRIPTION

The following discussion is presented to enable a person skilled in the art to make and use embodiments of the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1:
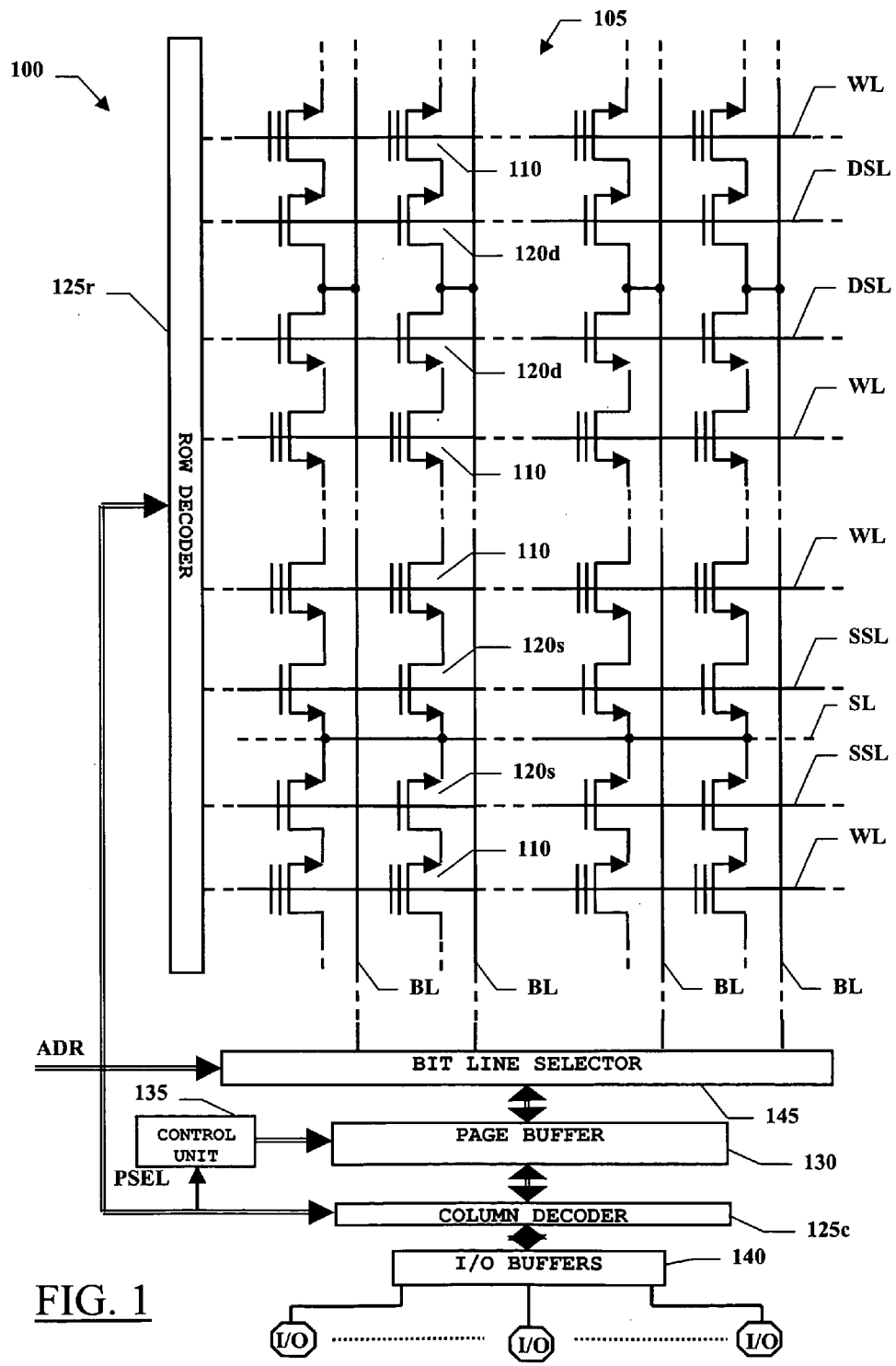
FIG. 1 is a circuital view of a non-volatile memory device, particularly of the NAND type.

With reference to the drawings, in FIG. 1 a non-volatile semiconductor memory, globally identified as 100, is illustrated, particularly an electrically-programmable, non-volatile semiconductor memory, for example a flash memory.

The flash memory 100 is integrated in a chip of semiconductor material (not shown), and includes a matrix 105 of memory cells 110 adapted to store data, arranged in a plurality of rows and a plurality of columns.

Typically, each memory cell 110 consists of an N-channel MOS transistor having a charge-storage element, such as a conductive floating gate adapted to be charged by electrons.

The flash memory 100 is a multi-level memory, particularly (for the sake of simplicity) a four-level memory, each cell being adapted to store a two-bit binary value, comprised of a Least Significant Bit (LSB) and a Most Significant Bit (MSB). Without entering into excessive details, well known to those skilled in the art, in an erased condition (first state, associated by convention with a logic value "11"), the memory cell 110 has a low threshold voltage value. The memory cell 110 may be programmed into any one of three further different states by causing amounts of electric charge to be put into the floating gate thereof. Each of these further three states is characterized by an increased threshold voltage value (given by an increased amount of floating-gate electric charge) compared to that of the preceding state. More particularly, a second state (associated with a logic value "10"), is characterized by a threshold voltage value that is higher than that of the first state, and that is in turn lower than that of a third state (associated with a logic value "00"). Finally, a fourth state (associated with a logic value "01"), is characterized by having the highest threshold voltage value. As will be made clearer in the following, when a selected memory cell 110 is selected for reading its content, the memory cell 110 will be conductive or not depending on its threshold voltage value and on the voltage value that is applied thereto during the reading.

The flash memory 100 has a so-called NAND architecture: in the matrix 105, groups of, e.g., eight, sixteen or even more (e.g., thirty-two) memory cells 110 are connected in series to each other to form a respective memory cells string, and different memory cells strings belonging to a same matrix column are connected in parallel to each other to a same bit line BL.

The memory cells 110 of a generic string are in particular connected in series between a source select N-channel MOS transistor 120s and a drain select N-channel MOS transistor 120d. A generic, intermediate memory cell 110 in the memory cells string has the drain terminal connected to the source terminal of an adjacent memory cell 110, and the source terminal connected to the drain terminal of another adjacent memory cell 110. One of the two end memory cells 110 located at the ends of the string has the drain terminal connected to the source terminal of the drain select transistor 120d; the drain terminal of the drain select transistor 120d is connected to the corresponding bit line BL, as well as to the drain terminal of the corresponding drain select transistor 120d of an adjacent memory cells string. Likewise, the other end memory cell 110 of the string has the source terminal connected to the drain terminal of the source select transistor 120s; the source terminal of the source select transistor 120s is connected to the source terminal of the corresponding source select transistor 120s of another adjacent memory cells string.

The control gate terminals of the memory cells 110 in each row are connected to a corresponding word line WL. The gate terminals of the drain select transistors 120d belonging to a common row of the matrix 105 are all connected to a corresponding drain select line DSL; similarly, the gate terminals of the source select transistors 120s belonging to a common row are all connected to a corresponding source select line SSL. The drain terminals of the drain select transistors 120d belonging to a common column of the matrix 105 are connected to a corresponding bit line BL. Conversely, the source terminals of all the source select transistors 120s in the matrix 105 are connected to a common source line SL (which is typically kept at a reference voltage, or ground).

The memory cells 110 belonging to the same row and thus coupled to the same word line WL are logically partitioned into different sets. Assuming, merely by way of example, that the matrix 105 includes 8192 bit lines BL, two sets of 4096 memory cells each for each word line WL are defined, a first set consisting for example of the memory cells 110 in an even position, and a second set consists of the memory cells 110 in an odd position.

As previously stated, the two bits stored in each memory cell 110 comprise an LSB and an MSB. Moreover, it subsists a correspondence between the logic values assumed by the LSB and MSB, and the threshold voltage values of the memory cells 110. For reducing the number of read accesses necessary to retrieve the stored data, the correspondence between logic values and threshold voltages makes use of the Gray coding.

Figure 2A:
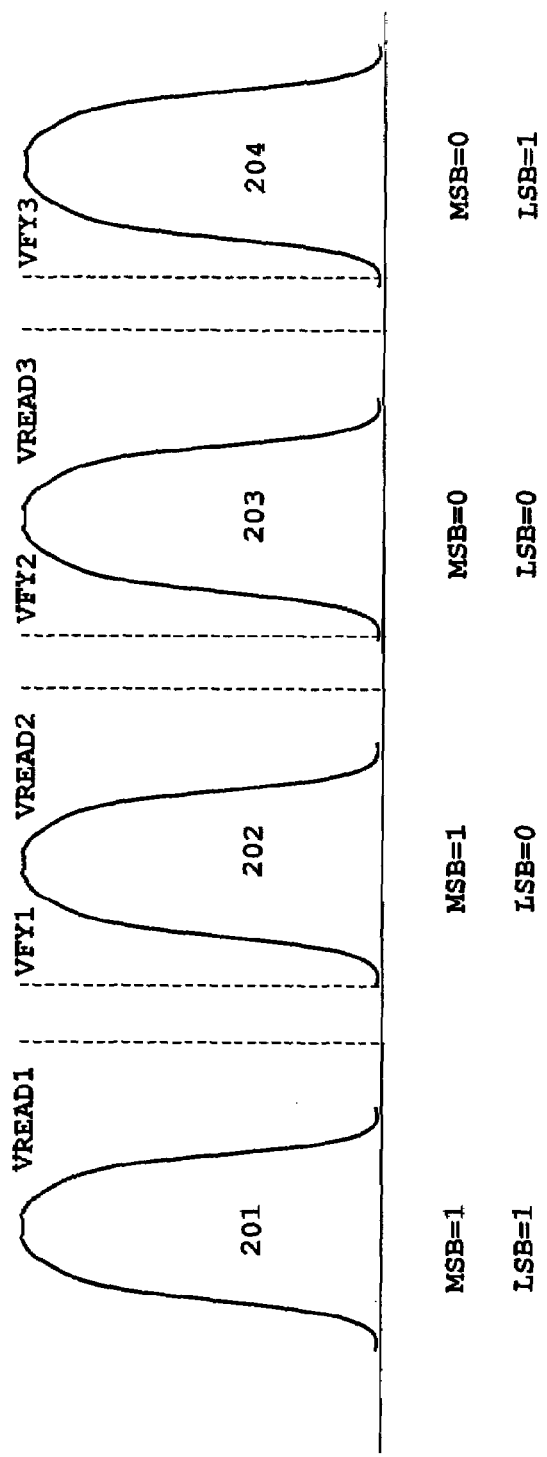
FIG. 2A is a simplified view of threshold voltages statistical distributions of the memory cells of the memory device of FIG. 1.

More particularly, referring to FIG. 2A, a simplified view of threshold voltages statistical distributions 201, 202, 203, 204 of the memory cells 110 is illustrated. More particularly, the distribution 201 represents the distribution of the threshold voltage values of the memory cells in the erased condition, i.e., of the cells belonging to the first state, associated with the logic value "11" (MSB=1, LSB=1). The distribution 202 represent the distribution of the threshold voltage values of the memory cells in the second state, associated with the logic value "10" (MSB=1, LSB=0); the distribution 203 represent the distribution of the threshold voltage values of the memory cells in the third state, associated with the logic value "00" (MSB=0, LSB=0); and the distribution 204 represent the distribution of the threshold voltage values of the memory cells in the fourth state, associated with the logic value "01" (MSB=0, LSB=1). The distributions are for example roughly Gaussian in shape, and are each one centered around a center threshold voltage value. Thanks to the Gray coding, states that are adjacent (in terms of their distribution of threshold voltage values) have corresponding logic values that differ from each other for only one bit.

Each word line WL corresponds, according to the present example, to four memory pages, each one corresponding to a specific group of bits. More particularly, a first LSB page includes the LSB stored in the memory cells 110 in even positions (belonging to the first set of memory cells), while a first MSB page includes the MSB stored in the memory cells in even positions. Furthermore, a second LSB page includes the LSB stored in the memory cells in odd positions (belonging to the second set of memory cells), while a second MSB page includes the MSB stored in the memory cells in odd positions. Consequently, the data stored into a single memory cell belongs both to an LSB page and to an MSB page.

Given that each memory cell 110 is capable of storing 2 bits, each set of 4096 memory cells stores 1024 bytes. Consequently, each memory page is capable of storing 512 bytes. Thus, if, still by way of example, the matrix 105 includes 2048 word lines WL, the memory 100 has a total of 8192 memory pages of 512 bytes each. It is pointed out that the number of bit lines and word lines as well as the size of the memory page, may greatly vary, in alternative embodiments of the present invention. In particular, the number of memory pages that are associated with a generic word line may be higher, particularly multiples of two, such as eight and so on.

The flash memory 100 may further include a plurality of redundant bit lines (not shown in FIG. 1), adapted to functionally substitute bit lines BL that, after the fabrication process of the flash memory, are possibly detected to be defective.

The flash memory 100 receives an address code ADR for selecting a desired memory page. A portion of the address code ADR is supplied to a row decoder 125r, which selects the desired word line WL, as well as the corresponding drain select line DSL and the corresponding source select line SSL. Another portion of the address code ADR is supplied to a column decoder 125c; the column decoder 125c connects I/O buffers 140, which are in turn associated with I/O terminals I/O of the flash memory 100, to a page buffer 130. A further portion of the address code ADR, denoted PSEL in FIG. 1, for example one bit, is used for selecting which one of the (two, in the example) memory pages (the memory page including the MSBs or the memory page including the LSBs of the memory cells of a given set) is addressed.

As will be described in greater detail in the following, the page buffer 130 is exploited as a temporary storage during read/program operations on the memory cells 110 of the selected page. The page buffer 130 has a storage capability at least equal to the storage capability of a memory page. For fitting an internal data parallelism of the flash memory 100 with a maximum external data parallelism, depending on a number p of the I/O terminals I/O (for example, eight or sixteen), the column decoder 125c provides to the page buffer 130 a data word to be written, or provides to the I/O terminals I/O a data word read, in chunks of p data bits at a time. Particularly, according to the decoding of the received portion of the address code ADR, the column decoder 125c connects desired portions of the page buffer 130 to the I/O terminals I/O.

The operation of the flash memory 100 is generally managed by a control unit, schematized as a block identified as 135, for example a microcontroller or a finite-state machine.

A memory page is selected by selecting a given word line WL, and a packet of bit lines BL; for example, if four memory pages of 512 Bytes each exist for each word line WL, one page corresponding to the LSB of the memory cells in even position, one corresponding to the MSB of the memory cells in even position, one corresponding to the LSB of the memory cells in odd position, and one corresponding to the MSB of the memory cells in odd position, the packet of selected bit lines BL includes the 4096 bit lines in even position or the 4096 bit lines in odd position (it has to be remembered that the data stored into a single memory cell belongs both to an LSB page and to an MSB page). The selection of the word line WL is directly performed by the row decoder 125r, while the selection of the packet of bit lines BL is performed by a bit line selector 145 between the matrix 105 and the page buffer 130. According to the decoding of a respective portion of the address code ADR, the bit line selector 145 selects the desired packet of bit lines and connects them to the page buffer 130.

During a read operation (page read), a data word stored in the selected memory page is read out and latched into the page buffer 130. The data word, temporarily stored in the page buffer 130, is then serially outputted through the I/O terminals I/O in chunks of, e.g., eight or sixteen bits by means of the column decoder 125c.

In greater detail, in order to access a given memory cell 110 for reading the content thereof, the drain select transistor 120d and the source select transistor 120s in the memory cells string to which the cell belongs are turned on, by asserting the drain select line DSL and the source select line SSL (for example, these two lines are brought to a voltage equal to a supply voltage Vdd of the memory). The bit line BL to which there is connected the string of cells containing the memory cell to be read is selected by the bit line selector 145. The row decoder 125r biases the word line WL to which the selected memory cell belongs to a specific reading voltage VREADX (X=1, 2, 3, as is explained in the following) adapted to discriminate the programming state of the memory cell. The remaining word lines WL controlling the gates of the other memory cells of the same string are all brought to a potential sufficiently high to ensure that these memory cells are turned on irrespective of their programming state (for example, a voltage of approximately 4.5 V). All the other word lines WL (associated with different memory cells strings) are for example kept grounded.

For reading the MSB of a memory cell 110, the row decoder 125r biases the word line WL to which the selected memory cell belongs to a reading voltage VREAD2, having a value that is intermediate between the center threshold voltages of the distribution 202 and the voltages of the distribution 203. If the threshold voltage of the selected memory cell 110 is lower than the reading voltage VREAD2, the selected memory cell 110 conducts, thus indicating that the MSB is equal to 1 (it has to be noted that it does not matter if the selected cell belongs to the distribution 201 or to the distribution 202, because both of which correspond to data values in which the MSB is equal to one). Conversely, if the threshold voltage of the selected memory cell 110 is higher than the reading voltage VREAD2, the selected memory cell 110 does not conduct, thus indicating that the MSB in the stored pair of bit is equal to 0. Thus, it can be appreciated that only one reading operation is necessary to retrieve the value of the MSB.

For reading the LSB two reading operations are necessary. More specifically, a first reading operation is performed by biasing, by means of the row decoder 125r, the word line WL to which the selected memory cell belongs to a reading voltage VREAD1, having a value that is intermediate between the center threshold voltages of the distributions 201 and 202. If the threshold voltage of the selected memory cell 110 is lower than the reading voltage VREAD1, the selected memory cell 110 conducts, thus indicating that it belongs to the distribution 201 (first programming state), and that the LSB is equal to 1. In this case, just one read access is necessary for retrieving the stored LSB. Conversely, if the threshold voltage of the selected memory cell 110 is higher than the reading voltage VREAD1, the selected memory cell 110 does not conduct, thus indicating that it does not belong to the distribution 201. In the latter case, a second reading operation needs to be performed, biasing the word line WL to which the selected memory cell belongs to a reading voltage VREAD3, having a value that is intermediate between the center threshold voltages of the distributions 203 and 204. If the threshold voltage of the selected memory cell 110 is lower than the reading voltage VREAD3, the selected memory cell 110 conducts, thus indicating that the LSB is equal to 0 (given that the first reading operation has indicated that the threshold voltage is higher than VREAD1). Conversely, if the threshold voltage of the selected memory cell 110 is higher than the reading voltage VREAD3, the selected memory cell 110 does not conduct, thus indicating that it belongs to the distribution 204, and that the LSB is equal to 1.

During a program operation (page program), a data word to be written, received from outside the memory through the I/O terminals I/O, is loaded into the page buffer 130. The data word to be written is received serially in, e.g., eight- or sixteen-bits chunks, and the page buffer 130 is thus replenished with data in a sequence of steps; when the buffer has eventually been filled, the data are written in parallel into the memory cells of a given selected page.

Memory cells 110 are programmed by Fowler-Nordheim tunneling of electrons into the floating gate. In order to access a given memory cell 110 for programming it, the drain select transistor 120d in the memory cells string to which the cell belongs is turned on by asserting the drain select line DSL (for example, bringing this line to the supply voltage Vdd), whereas the source select transistor 120s is kept off by keeping the source select line SSL deasserted (e.g., grounded); the bit line BL to which there is connected the string of cells containing the memory cell to be programmed is selected by the bit line selector 145. The row decoder 125r biases the word line WL to which the selected memory cell belongs to a programming voltage VPROG, whose value and evolution in time is a function of the programming state that the memory cell 110 has to assume at the end of the program operation. As previously disclosed, the fact that a memory cell 110 is in a particular state is determined by its threshold voltage value, that is in turn determined by the amount of charge present in the corresponding floating gate. Moreover, the amount of charge is in some way proportional to the value and to the rate of increase of the programming voltage VPROG that is applied to the memory cell 110 (e.g., the higher the target threshold voltage value, the higher is the value of the programming voltage VPROG to be applied). The remaining word lines WL controlling the gates of the other memory cells of the same string are all brought to a potential relatively high (e.g., approximately 10 V), for reasons that will be described later, but sufficiently lower than the programming voltage not to cause spurious programming. All the other word lines WL (associated with different memory cells strings) are for example kept grounded.

In order to program the selected memory cell, the bit line BL is kept grounded, so that the drain select transistor 120d is surely kept on. The ground voltage at the bit line, propagating through the drain select transistor and the channel of the memory cells in the string, reaches the channel of the memory cell to be programmed; here, the voltage difference between the control gate (at the programming voltage VPROG) and the channel (close to the ground voltage) experienced by the selected memory cell is sufficient to cause electron tunneling into the floating gate. On the contrary, if the bit line is biased at a higher potential, for example equal to the memory supply voltage (Vdd, e.g. 3 V), as the drain select line DSL, the drain select transistor 120d turns off. Meanwhile, the voltage of the memory cells string rises. The channels of the memory cells of the selected memory cells string thus remain floating, and, thanks to the relatively high voltage (10 V) applied to the word lines WL to which the selected memory cell does not belong, the string channel voltage rises due to the capacitive coupling to a value such that the control gate-to-channel voltage difference at the selected memory cell is not sufficient to cause significant electron tunneling, and the memory cell is not programmed.

In this way, by applying to the selected bit lines the proper voltage, the cells 110 of the selected page to be brought to the desired logic value are then programmed, while the other cells 110 are left unchanged. In the same way as in the case of the read operation, for performing a program operation on both the LSB and the MSB, more steps are required. More specifically, assuming that each program operation is performed on erased memory cells 110 (i.e., in the first state), an LSB program operation is firstly performed: if the selected memory cell 110 has to be programmed in such a way to have an LSB value that is equal to 0, the programming voltage VPROG that biases the selected word line WL is such as to bring the threshold voltage of the selected memory cell to the distribution 202 (i.e., to the second state). Otherwise, the threshold voltage of the selected memory cell 110 remains in the first distribution (first state, or erased state).

Having executed the LSB program operation, the whole program operation is completed by means of the programming of the MSB value. More specifically, if the selected memory cell 110 has to be programmed in such a way to have an MSB value that is equal to 1, no further application of programming voltage VPROGR is needed. Consequently, the threshold voltage of the memory cell remains at the value it reached in the previous step (i.e., belonging to the distribution 201 if LSB is 1, and belonging to the distribution 202 if LSB is 0). On the contrary, if the selected memory cell 110 has to be programmed in such a way to have an MSB value that is equal to 0, the programming voltage VPROG is such as to bring the threshold voltage of the selected memory cell to the distribution 204 (i.e., to the fourth state) if the LSB is equal to 1 (i.e., if the threshold voltage before the MSB programming belonged to the distribution 201); conversely, if the LSB is equal to 0 (i.e., if the threshold voltage before the MSB programming belonged to the distribution 202), the programming voltage VPROG is such as to bring the threshold voltage of the selected memory cell to the distribution 203 (i.e., to the third state).

It should be noted that, in a practical implementation, the previously described program operations are more complex. In fact, a possible program operation includes the repetition of a plurality of steps, at each step increasing the programming voltage VPROGR (up to a maximum value, e.g. 20V), and, after the application of the programming voltage, the execution of a verify phase for determining if the desired threshold voltage value has been reached. These features will be explained in greater detail referring to the following description of the page buffer embodiment herein disclosed.

The erase operation has the purpose of bringing a block of memory cells 110 back to the erased state (logic value "11"), wherein by memory cells block there is intended a group of memory cells 110 corresponding to all the word lines WL of a string.

In order to erase a given block of memory cells 110, the semiconductor well including all the cells of the matrix 105 is biased to a relatively high erase voltage VERASE (e.g., 20 Volts) by means of an erase control circuit, not shown in the figures, and all the bit lines BL of the matrix 105 are kept floating. Moreover, the row decoder 125r biases the word lines WL corresponding to the block to the ground voltage, while the remaining word lines WL of the matrix 105 are kept floating. The drain select lines DSL and the source select lines SSL of the block are kept floating (but they are precharged at about the supply voltage Vdd before the well is biased to the erase voltage VERASE), while the remaining are grounded. In this way, each memory cell 110 included in the selected block is biased in such a way to trigger the removal (by means of tunneling effect) of the electrical charge possibly stored in its floating gate. As previously noted referring to the case of the program operation, even the erase operation is in practice more complex, including erase verify phases and soft program operations. Again, these additional features will be explained in greater detail referring to the following description of the page buffer embodiment disclosed herein.

Figure 2B:
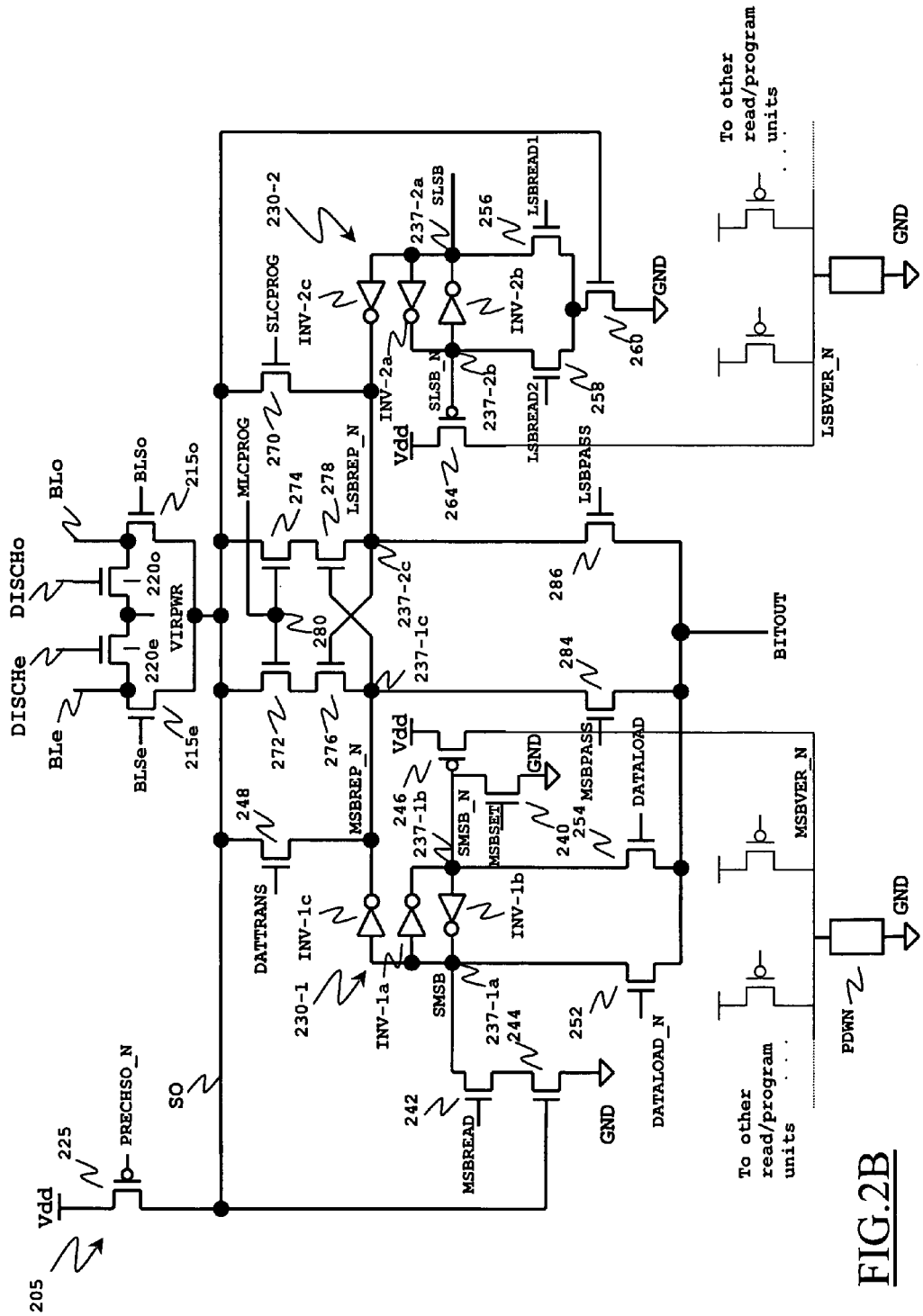
FIG. 2B illustrates the circuital view of a read/program unit included in the page buffer of the memory device of FIG. 1 according to an embodiment of the present invention.

In FIG. 2B the circuit structure of a part of the page buffer 130 is shown, according to an embodiment of the present invention.

It has to be underlined that, unless differently specified, the signals described in connection with the FIG. 2B are to be intended as logic signals, i.e., adapted to assume two voltage values, that is the supply voltage Vdd, and the ground voltage.

In the exemplary invention embodiment herein described, it is assumed that the page buffer 130 is adapted to implement operations more complex than a simple page read, a simple page program, and a simple erase operation. In particular, it is assumed that the page buffer 130 is adapted to implement operations such as a cache read operation, and a cache program operation, as will be described in detail later.

The page buffer includes a read/program unit 205 for each pair of adjacent bit lines (also each pair of redundant bit lines is associated with a corresponding read/program unit 205). Particularly, an even bit line BLe and an odd bit line BLo are electrically couplable to a common node SO through respective N-channel MOS transistors 215e and 215o, included in the bit line selector 145. The transistors 215e and 215o have the respective drain terminal connected to the corresponding bit lines BLe, BLo, and the source terminals connected to the node SO; the gate terminals of the transistors 215e and 215o are controlled by respective select signals BLSe and BLSo, respectively. Two N-channel MOS transistors 220e and 220o are also provided in the bit line selector 145, each one for precharging/discharging the respective bit line BLe and BLo to a biasing voltage VIRPWR (such a precharge/discharge operation is preferably performed before any program operation, as described in the following). To this purpose, the transistors 220e and 220o have the source terminals connected to the corresponding bit lines BLe, BLo; the drain terminals of the transistors 220e and 220o are connected together to a terminal for providing the biasing voltage VIRPWR. The gate terminals of the transistors 220e, 220o are controlled by respective precharge/discharge signals DISCHe, DISCHo.

A P-channel MOS transistor 225 is used for precharging the node SO during certain phases of the page buffer functioning, e.g., at the beginning of a read/program operation. For this purpose, the transistor 225 has the drain terminal connected to the node SO, the source terminal connected to a terminal providing the supply voltage Vdd, and the gate terminal controlled by a pre-charge signal PRECHSO_N.

The read/program unit 205 includes a first latch 230-1 and a second latch 230-2. The latch 230-1 is adapted to be employed for the reading of the MSB, for the programming of the MSB, for the loading of data from the outside of the page buffer during a writing operation, for the cache read and for the cache program operations. The latch 230-2 is instead adapted to be employed for the reading of the LSB, for the programming of the LSB and the MSB, for the cache read and for the erase operations.

The latch 230-1 is formed by two inverters INV-1a and INV-1b, connected in a loop with the input terminal of the inverter INV-1a connected to the output terminal of the inverter INV-1b so as to define a node 237-1a, providing a signal SMSB, and the output terminal of the inverter INV-1a connected to the input terminal of the inverter INV-1b so as to define a node 237-1b, providing a signal SMSB_N that is the logic complement of the signal SMSB. Moreover, a further inverter INV-1c has an input terminal connected to the node 237-1a, and an output terminal that is connected to a node 237-1c, providing it the signal MSBREP_N, having the same polarity of the signal SMSB_N.

An N-channel MOS transistor 240 is used to set the latch 230-1; by "set the latch" there is meant bringing the signal SMSB to the supply voltage VDD. For this purpose, the transistor 240 has the drain terminal connected to the node 237-1b, the source terminal connected to ground and the gate terminal controlled by an MSB latch reset signal MSBSET. The latch 230-1 is reset (i.e., the signal SMSB is brought to the ground voltage) by means of two N-channel MOS transistors 242 and 244 that are connected in series. The transistor 242 has the drain terminal connected to the node 237-1a and the source terminal connected to the drain terminal of the transistor 244. The source terminal of the transistor 244 is connected to ground. The gate terminal of the transistor 244 is controlled by the voltage at the node SO, whereas the gate terminal of the transistor 242 is controlled by a MSB latching or read signal MSBREAD.

A P-channel MOS transistor 246 is used during a program verify phase for establishing if a MSB program operation has been accomplished in the correct way. For this purpose, the transistor 246 has the source terminal connected to a terminal providing the supply voltage Vdd, a gate terminal connected to the node 237-1b, and the drain terminal connected (node MSBVER_N) to a first terminal of a highly-resistive pull down circuit PDWN, the latter having a second terminal connected to ground. The pull down circuit PDWN is placed outside the single read/program unit 205, and its first terminal is commonly connected to transistors 246 in all the other read/write units included in the page buffer 130, in the same way as for the read/write unit herein described.

An N-channel MOS transistor 248 is used to couple the node 237-1c to the node SO, in order to allow the data transfer from the latch 230-1 to the latch 230-2. For this purpose, the transistor 248 has the drain terminal connected to the node SO and the source terminal connected to the node 237-1c. The gate terminal of the transistor 248 is controlled by a data transfer signal DATTRANS.

N-channel MOS transistors 252 and 254 are used to load data to be written into the first latch 230-1 at the beginning of a program operation. For this purpose, the transistors 252 and 254 have respective drain terminals connected to the nodes 237-1a and 237-1b. The source terminals of the transistors 252 and 254 are connected together to an I/O data line BITOUT in turn connected to the column decoder 125c. The gate terminal of the transistor 252 receives a data load signal DATALOAD_N (whose logic state determines the target value to be loaded into the first latch 230-1) and the gate terminal of the transistor 254 receives a further data load signal DATALOAD (which is the logic complement of the data load signal DATALOAD_N).

The latch 230-2 is formed by two inverters INV-2a and INV-2b, connected in a loop with the input terminal of the inverter INV-2a connected to the output terminal of the inverter INV-2b so as to define a node 237-2a, providing a signal SLSB, and the output terminal of the inverter INV-2a connected to the input terminal of the inverter INV-2b so as to define a node 237-2b, providing a signal SLSB_N that is the logic complement of the signal SLSB. Moreover, a further inverter INV-2c has an input terminal connected to the node 237-2a, and an output terminal that is connected to a node 237-2c, providing it the signal LSBREP_N, having the same polarity of the signal SLSB_N.

Three N-channel MOS transistors 256, 258 and 260 are used to set/reset the latch 230-2 and to read/verify the LSB. For this purposes, the transistor 256 has the drain terminal connected to the node 237-2a, the source terminal connected to the drain terminal of the transistor 260, and the gate terminal controlled by a first LSB latching or read signal LSBREAD1. The transistor 258 has the drain terminal connected to the node 237-2b, the source terminal connected to the drain terminal of the transistor 260, and the gate terminal controlled by a second LSB latching or read signal LSBREAD2. Moreover, the transistor 260 has the source terminal connected to a terminal providing the ground voltage, and the gate terminal connected to the node SO.

A P-channel MOS transistor 264 is used during verify phases for establishing if an erase operation, or an LSB or an MSB program operation has been accomplished in the correct way. For this purpose, the transistor 264 has the source terminal connected to a terminal providing the supply voltage Vdd, a gate terminal connected to the node 237-2*b*, and the drain terminal connected (node LSBVER_N) to a first terminal of a further highly-resistive pull down circuit (not shown in the figure for the sake of simplicity), having the same features of the highly-resistive pull down circuit PDWN, and connected to all the read/write units included in the page buffer 130.

A further N-channel MOS transistor 270 is used to couple the node 237-2*c* to the node SO, thus to the selected bit line BLe or BLo, during a program operation (as described in greater detail in the following). For this purpose, the transistor 270 has the drain terminal connected to the node SO and the source terminal connected to the node 237-2*c*; the gate terminal of the transistor 270 is controlled by a program signal SLCPROG.

The read/program unit 205 further includes a four transistors structure that is used for programming the MSB. More particularly, the structure includes four N-channel MOS transistors 272, 274, 276 and 278. The transistor 272 has the drain terminal connected to the node SO, the source terminal connected to the drain terminal of the transistor 276, and the gate terminal connected to the gate terminal of the transistor 274 (node 280). The transistor 274 has the drain terminal connected to the node SO, the source terminal connected to the drain terminal of the transistor 278, and the gate terminal that is connected to the node 280. The transistor 276 has the source terminal connected to the node 237-1*c*, and the gate terminal connected to the node 237-2*c*. The transistor 278 has the source terminal connected to the node 237-2*c*, and the gate terminal connected to the node 237-1*c*. Moreover, the node 280 receives a further program signal MLCPROG.

Two N-channel MOS transistors 284, 286 are used for providing data to the output of the page buffer 130. More particularly, the transistor 284 has the drain terminal connected to the node 237-1*c*, the source terminal connected to the I/O data line BITOUT, and the gate terminal controlled by a MSB output signal MSBPASS. The transistor 286 has the drain terminal connected to the node 237-2*c*, the source terminal connected to the I/O data line BITOUT, and the gate terminal controlled by a LSB output signal LSBPASS.

In the following all the possible operations executed by the page buffer 130 will be described (i.e., for executing read, program, and erase operations). For the sake of brevity, reference will be made only to the cases in which the selected memory cells 110 that are to be read, programmed and erased are connected to the even bit lines BLe (i.e., corresponding to an even page), being the case that for odd bitlines BLo operation is exactly the same. More specifically, the following description will refer in particular to a single read/program unit 205. Consequently, although reference will be made also to whole memory pages, the description will deal in great detail only with a single memory cell 110 thereof, and with its corresponding string.

LSB Read Operation

As previously stated, thanks to the adoption of the Gray coding and thanks to the fact that the data stored into each single memory cell belongs to two memory pages (both to an LSB page and to an MSB page), an LSB read operation requires executing at most two reads, one exploiting the reading voltage VREAD1, and one exploiting the reading voltage VREAD3. Firstly, the latch 230-2 is set. To this purpose, the node SO is driven to the supply voltage Vdd by means of the transistor 225, that is activated by driving the signal PRECHSO_N to the ground voltage. At the same time, the signal LSBREAD2 is driven to the supply voltage Vdd. In this way, the transistors 258 and 260 turn on, forcing the node 237-2*b* to the ground voltage. Thus, the signal SLSB_N assumes the ground voltage value, and the signal SLSB is driven by the latch 230-2 to the supply voltage Vdd.

The next step consists of precharging the selected (even) bit lines BLe at a predetermined voltage value. For this purpose, the transistor 225 remains kept on, while the select signal BLSe (that is provided to the gate terminal of the transistor 215*e*) is driven to a predetermined voltage V1.

Consequently, the (parasitic capacitance associated with) bit line BLe charges and reaches a voltage equal to V1 minus threshold voltage VTHN of the transistor 215*e*, while the node SO remains at the supply voltage. In the meantime, the word line WL corresponding to the selected page of memory cells 110 is driven by the row decoder 125*r* to the reading voltage VREAD1, the remaining word lines WL controlling the gates of the other memory cells of the selected string are all brought to a potential sufficiently high (e.g., 5.5 V) to ensure that these memory cells are turned on irrespective of their programming state, and the selected drain select line DSL is driven to the supply voltage Vdd. At this time, the transistor 225 turns off (the signal PRECHSO_N is driven back to the supply voltage Vdd), the select signal BSLe is driven to the ground voltage, and the source select line SSL corresponding to the selected string is driven to the ground voltage too.

In this way, the selected string is capable to conduct or not depending on the state of the selected memory cell 110. Given that the selected bit line BLe was charged to (and then left floating at) a voltage equal to V1-VTHN, the bit line begins to discharge if the threshold voltage of the selected memory cell is lower than the reading voltage VREAD1 (i.e., the selected memory cell 110 is conductive), otherwise the bit line remains at the voltage V1-VTHN. Meanwhile, the node SO remains charged at the supply voltage Vdd. Subsequently, the select signal BLSe is driven to a further predetermined voltage V2, whose value is lower than that of the predetermined voltage V1. If the voltage of the selected bit line BLe has reached a value that is lower than V2-VTHN, the transistor 215*e* turns on, thus forcing the voltage of the node SO to assume a voltage value equal to that of the selected bit line BLe (i.e., close to the ground voltage), otherwise the transistor 215*e* remains turned off, and the node SO remains at a voltage equal to the supply voltage Vdd. At this moment, the signal LSBREAD1 is driven to the supply voltage Vdd. If the node SO is still at the supply voltage Vdd (turning on the transistor 260), the node 237-2*a* is brought to the ground voltage through the transistors 256 and 260 (SLSB driven to ground voltage).

In this way, the latch 230-2 switches, and thus the signal SLSB_N is driven to the supply voltage Vdd. This means that the LSB in the selected cell is equal to 0. Contrarily, if the node SO has been discharged, the transistors 256, 260 and the latch 230-2 are properly sized in such a way that the latch 230-2 does not switch (SLSB_N=0, SLSB=Vdd). This implies that the LSB in the selected cell is equal to 1. In fact this latter case takes place if the threshold voltage of the selected memory cell 110 belongs to the distribution 201, and thus the selected string is capable to drain current and to thereby discharge the node SO.

The second read phase (the one exploiting the reading voltage VREAD3) proceeds in a way similar to the one previously described. The only differences consist in the fact that this time the word line WL corresponding to the selected page of memory cells 110 is driven by the row decoder 125*r* to the reading voltage VREAD3, and it is the transistor 258, driven by the signal LSBREAD2, rather than the transistor 256, that is used for causing the latch 230-2 to switch. In this way, if the node SO remains at the supply voltage Vdd (which occurs only when the selected memory cell 110 has the threshold voltage belonging to the distribution 204, and thus does not drain current), the signal SLSB_N at the node 237-2b is brought to the ground voltage. This implies that the LSB in the selected cell is equal to 1. If instead the node SO is discharged, the LSB value is the same as the one given by the previous read (that is, the one exploiting the reading voltage VREAD1): more specifically, LSB=1 if the threshold voltage of the selected memory cell belongs to the distribution 201, and LSB=0 if the threshold voltage belongs to the distribution 202 or 203.

After these two reads, the correct LSB value is stored in the latch 230-2. More particularly, if the signal SLSB is equal to the supply voltage Vdd (SLSB_N equal to the ground voltage), it means that the LSB is equal to 1, and if the signal SLSB is equal to the ground voltage (SLSB_N equal to the supply voltage Vdd), it means that LSB is equal to 0.

The retrieved LSB value can be provided to the outside of the page buffer 130 (i.e., to the column decoder 125c and to the I/O buffers 140) using the value of the signal LSBREP_N, equal to the value of the signal SLSB_N. Said value of the signal LSBREP_N is in turn provided to the I/O data line BITOUT activating the transistor 286 by asserting to the supply voltage Vdd the signal LSBPASS.

Given that the number of bits read in parallel in a page is of the order of 16K (i.e., the page buffer 130 includes 16K read/program units 205 that perform the reading operations in a parallel way), and given that the read bits are provided to the I/O terminals of the I/O buffers 140 in group of 8/16 parallel bits according to synchronous steps during about 50 nsec each one, the whole output phase takes a time of the order of hundred of microseconds. During this phase, it is possible to use the latch 230-1 for performing an MSB reading, thus executing the so-called cache read. In fact, all the LSB bits previously read are stored in the latch 230-2 of the corresponding read/program unit 205 as in a sort of temporary memory register, that is not used during the MSB read operation.

Figure 2C:
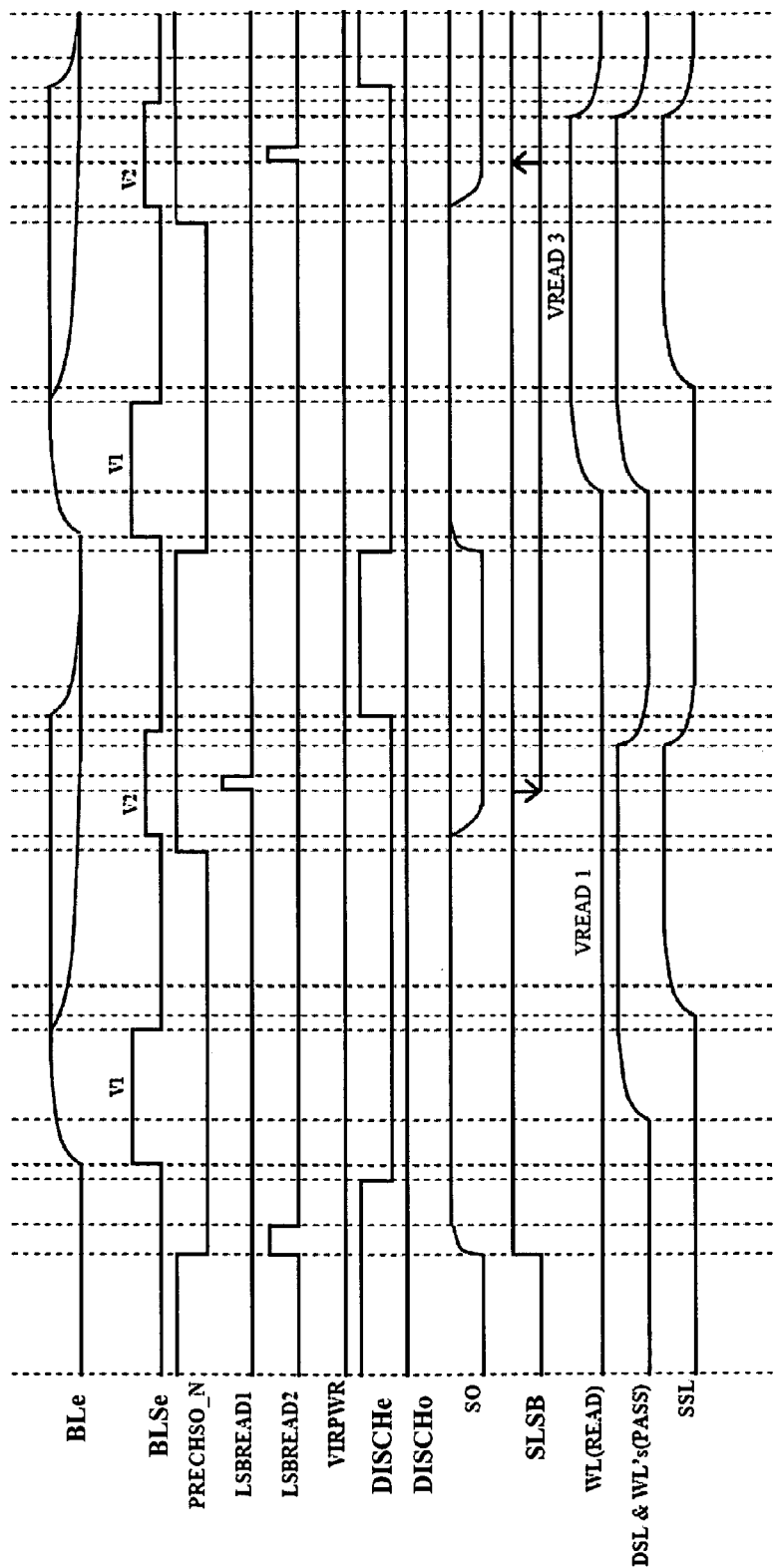
FIG. 2C illustrates a timing diagram corresponding to an LSB read operation.

Referring now to FIG. 2C, a timing diagram showing the temporal evolutions of a plurality of signals that are involved in the memory device during an LSB read operation is illustrated.

It has to be noted that, for performing the LSB read operation previously cited, one or at most two reading accesses are necessary. This is possible thanks to the choice of using the Gray coding for associating the logic values to the corresponding states, and thanks to the fact that the data stored into each single memory cell belongs to two memory pages.

MSB Read Operation

Referring now to an MSB read operation, a first step consists in opportunely setting the latch 230-1. For this purpose the signal MSBSET is driven to the supply voltage Vdd, thus activating the transistor 240. In this way, the signal SMSB_N at the node 237-1b is driven to the ground voltage. Consequently, the signal SMSB at the node 237-1a is driven by the latch 230-2 to the supply voltage Vdd. The MSB read operation is similar to the LSB read operation. Briefly, the selected (even) bit line BLe is charged to the voltage V1-VTHN, in the same way as in the LSB case.

Subsequently, the signal MSBREAD is asserted to the supply voltage, while the select signal BLSe is driven to the voltage V2. Moreover, the word line WL corresponding to the selected page of memory cells 110 is driven by the row decoder 125r to the reading voltage VREAD2, the remaining word lines WL controlling the gates of the other memory cells of the selected string are all brought to a potential sufficiently high to ensure that these memory cells are turned on irrespective of their programming state, and the selected drain select line DSL is driven to the supply voltage Vdd. In this way, if the threshold voltage of the selected memory cell 110 is higher than the reading voltage VREAD2, the node SO remains at the supply voltage Vdd, and the transistor 244 turns on. In this case, the node 237-1a discharges, and the corresponding signal SMSB is brought to the ground voltage, which means that MSB is equal to 0.

On the contrary, if the node SO discharges, the transistor 244 does not turn on, and the signal SMSB remains at the supply voltage Vdd, thus meaning that MSB is equal to 1. The MSB value can be provided to the outside of the page buffer 130 (i.e., to the column decoder 125c and to the I/O buffers 140) using the value of the signal MSBREP_N, equal to the value of the signal SMSB_N (having a voltage value that is complementary to the one of the signal SMSB). The value of the signal MSBREP_N is in turn provided to the I/O data line BITOUT activating the transistor 284 asserting the signal MSBPASS to the supply voltage Vdd.

Also in this case, it is possible using the other latch (i.e., the latch 230-2) for performing an LSB read operation during the output of the content of the page buffer. In fact, all the MSB bits previously read are stored in the latch 230-1 of the corresponding read/program unit 205 as in a sort of memory register, that is not used during an LSB read operation. Consequently, also in this case it is possible to perform a cache read operation.

Figure 2D:
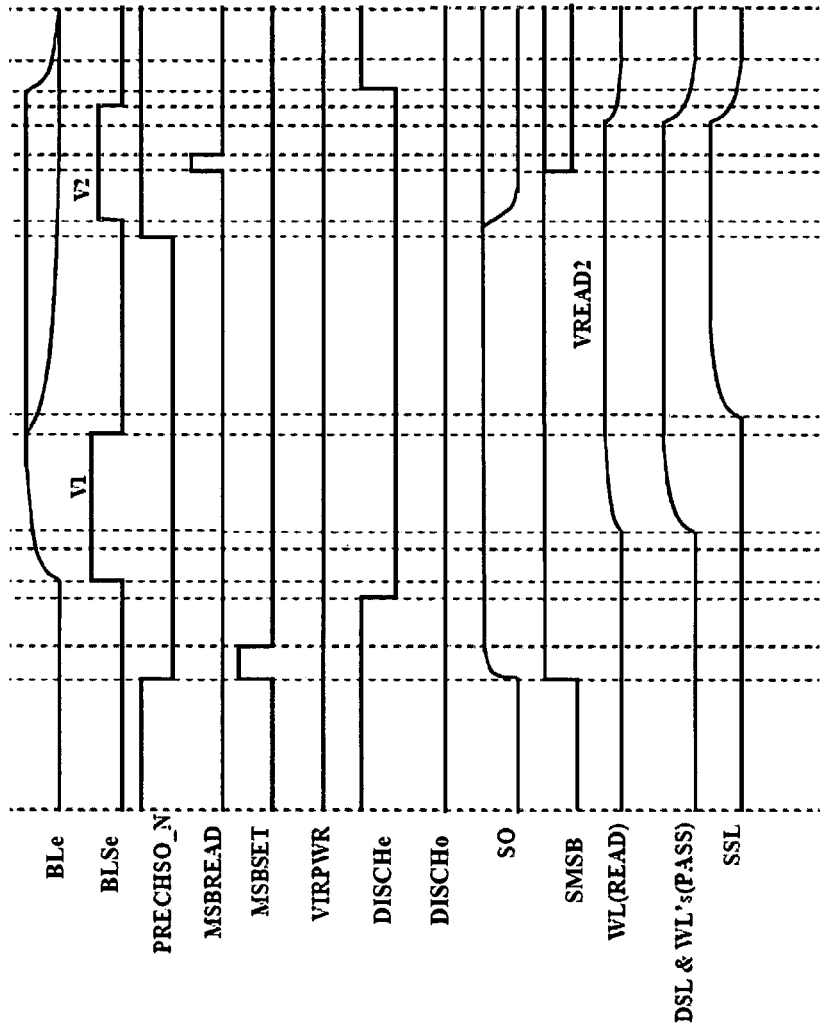
FIG. 2D illustrates a timing diagram corresponding to an MSB read operation.

Referring now to FIG. 2D, a timing diagram showing the temporal evolutions of a plurality of signals that are involved in the memory device during an MSB read operation is illustrated.

It has to be noted that the page buffer 130 is operated to execute an MSB read operation rather than an LSB read operation (or vice versa) depending on whether an MSB memory page rather then an LSB memory page has been addressed. This is controlled by the control unit 135 that decodes and recognizes the value of the address portion PSEL. In fact, the control unit 135 generates all the signals adapted to drive the execution of all the procedures necessary for performing an LSB read operation (e.g., applying the reading voltages VREAD1 and VREAD3) or for performing an MSB read operation (e.g., applying the reading voltage VREAD2), depending on the value of the address portion PSEL.

LSB Program Operation

Referring now to the procedures carried out by the page buffer 130 for performing an MSB and an LSB program operation, it is to be underlined that the memory cells 110 belonging to a same word line WL are programmed in parallel, and are applied a same programming pulse at their gate terminal. The main task of the page buffer 130 during this phase is to determine if a single memory cell 110 belonging to said word line WL has to be programmed or not. For this purpose, each read/program unit 205 properly biases the corresponding bit line, in such a way that if the latter is maintained at the ground voltage, the corresponding memory cell 110 is programmed, otherwise, if the bit line is maintained to the supply voltage Vdd (more generally, to a program inhibit voltage), the corresponding memory cell 110 does not have and will not have to be programmed, even if it receives the programming pulse on its control gate. The memory cells 110 that are to be programmed have their threshold voltages that belong to the distribution 201, i.e., they are erased memory cells (for example, before being applied programming pulses, they are all erased).

The first step for programming the LSB is to store the target LSB value that has to be programmed in the read/program unit 205, using the latch 230-1 (data load procedure). For this purpose, the node 237-1$a$ is firstly brought to the ground voltage (reset operation). This is accomplished by precharging the node SO to the supply voltage Vdd by means of the transistor 225 (activated by the signal PRECHSO_N), and then asserting the signal MSBREAD to the supply voltage. In this way, both the transistors 242 and 244 turn on, and the signal SMSB at the node 237-1$a$ assumes the ground voltage. It is observed that the reset operation considered per-se places the latch in a condition such that the corresponding memory cell is not programmed. This is necessary for the read/program units associated with defective bit lines that have been functionally replaced by redundant ones, because a read/program unit that is connected to a defective bit line does not execute a data load procedure. Moreover, this reset operation is necessary in the case in which the page buffer 130 performs a partial data load procedure, i.e., when only a part of read/program units 205 included therein receives the corresponding desired LSB value that has to be programmed. In this way, the read/program units 205 that do not have to perform a data load procedure act in the same way as they would act should they receive during the data load procedure the information of not executing any program operation on the respective memory cells. Having reset the signal SMSB, the next step consists of setting the signal SLSB at the node 237-2$a$. For this purpose, the signal SLSB_N at the node 237-2$b$ (the logic complement of the signal SLSB) is brought to the ground voltage. This is accomplished by asserting the signal LSBREAD2 to the supply voltage. In this way, both the transistors 258 and 260 turn on (the node SO is still at the supply voltage Vdd), and the signal SLSB_N at the node 237-28 assumes the ground voltage.

Subsequently, the data load procedure is executed. For this purpose, the I/O data line BITOUT is driven to the ground voltage, and the transistors 252 and 254 are activated in a mutually exclusive way by means of the signals DATALOAD and DATALOAD_N in such a way to force to the ground voltage the signal SMSB or the signal SMSB_N, respectively. More particularly, if the LSB has to assume the 0 value, the program operation has to be enabled, forcing the signal SMSB_N to the ground voltage by asserting the signal DATALOAD to the supply voltage Vdd. On the contrary, if the LSB has to assume the 1 value, the program operation has to be inhibited, forcing the signal SMSB to the ground voltage by asserting the signal DATALOAD_N to the supply voltage Vdd.

The next operation consists in transferring the data stored in the latch 230-1 to the latch 230-2, and this operation is referred to as data transfer. For this purpose, the node SO is precharged to the supply voltage, by means of the transistor 225. Then, the signal DATTRANS is asserted to the supply voltage Vdd. In this way, if the signal MSBREP_N at the node 237-1$c$ (that has the same polarity as the signal SMSB_N) has a voltage equal to the ground voltage, the node SO discharges through the inverter INV-1$c$, otherwise, if the signal MSBREP_N has a voltage equal to the supply voltage, the node SO remains at the supply voltage too. Meanwhile, the transistor 256 is turned on by asserting the signal LSBREAD1 to the supply voltage Vdd. In this way, if the node SO has a voltage equal to the ground voltage, the signal SLSB remains at the supply voltage, otherwise, if the node SO has a voltage equal to the supply voltage Vdd, the signal SLSB is brought to the ground voltage. Thus, at the end of the data transfer operation, the signal SLSB has a voltage equal to that of the signal SMSB.

After this phase, the program operation is started. For this purpose, both the even bit line BLe and the odd bit line BLo are precharged to the supply voltage Vdd by asserting the signal VIRPWR to the supply voltage Vdd and by activating the transistors 220$e$ and 220$o$ by means of the signals DISCHe and DISCHo, respectively. These latter signals have voltage values that are higher than that of the supply voltage Vdd by at least a threshold voltage. Before applying to the selected word line WL the programming voltage VPROG, the transistor 270 is turned on by asserting the signal SLCPROG to the supply voltage Vdd, and the select signal BLSe provided to the gate of the transistor 215$e$ is driven to the supply voltage Vdd. If the signal LSBREP_N is at the ground voltage, the selected (even) bit line BLe discharges, otherwise, if the signal LSBREP_N is at the supply voltage Vdd, the selected bit line BLe remains at the supply voltage Vdd. By applying to the selected word line WL the programming voltage VPROG, the selected memory cell 110 will be programmed in the first case, otherwise, in the second case, the selected memory cell 110 will not be programmed.

As previously mentioned, the program operation includes the repetition of a plurality of steps, each step including the application to the selected word line of a pulse of programming voltage VPROGR, which value increases at each step (up to a maximum value), and then the execution of a verify phase for determining if the desired threshold voltage value has been reached. Thus, the programming of the threshold voltage of the selected memory cell occurs by means of small increments thereof (e.g., of 100 mV per step). The specific number of steps that are necessary to increment the threshold voltage of the selected memory cell until it reaches the desired distribution is not known, because each memory cell responds to the same programming voltage VPROGR in a different way (because of the unavoidable mismatches among different cells given by the tolerances of the process parameters). Furthermore, memory cells belonging to the same word line WL typically need different numbers of steps for reaching the corresponding desired distributions (that can be different from cell to cell).

Consequently, after each of the programming steps a verify phase is needed. If the verify on a particular memory cell 110 gives an affirmative result, the read/program unit 205 corresponding thereto has to inhibit any further programming step on its corresponding memory cell, while the other memory cells corresponding to read/program units 205 in which the verify has not provided an affirmative result, are still subjected to further programming steps. The verify phase corresponding to each one of the threshold distributions 202, 203, 204 is a reading operation that makes use of reading voltages that are slightly higher than the corresponding reading voltage VREADX (X=1, 2, 3). In the case of an LSB program verify read, a verify reading voltage VFY1 is used that has a value slightly higher than the value VREAD1. In this case, if the verify phase has given an affirmative result (i.e., the threshold voltage of the selected memory cell 110 has reached the distribution 202), the read/write unit 205 has to force the voltage of the selected bitline to the supply voltage Vdd, in such a way to inhibit any further programming on the corresponding memory cell 110.

The verify starts with the precharging of the bit lines to a voltage equal to V1-VTHN (this is accomplished in the same way as in the previous operations), then proceeds with a read operation exploiting the verify reading voltage VFY1 on the selected word line WL, and activating the transistor 256 by asserting the signal LSBREAD1 to the supply voltage. It has to be noted that the verify phase it is not preceded by any setting, differently from the case of normal read operation.

If the verify has provided that the selected memory cell 110 is programmed in the correct way (its threshold voltage has reached the distribution 202), the node SO will remain at the supply voltage Vdd. Thus, in the following programming step (that provides again for the precharging of the selected even bit line BLe SO to the supply voltage Vdd), the selected even bit line BLe will remain at the supply voltage Vdd and thus the corresponding memory cell 110 will be not programmed. On the contrary, if the verify has provided that the selected memory cell 110 is not programmed (its threshold voltage has not reached the distribution 202), the signal SLSB_N will remain at the ground voltage, and in the following programming step, the selected even bit line BLe will be discharged again, and thus the selected memory cell 110 will be subjected to a further programming step.

The loop comprising the repetition of program operations and verify phase ends when the nodes 237-2b (corresponding to the signals SLSB_N) of all the read/program units 205 of the page buffer 130 assume voltage values equal to the supply voltage Vdd. At this point, all the transistors 264 will be turned off, and the voltage value of the node LSBVER_N (that is common to all the read/program units 205 of the page buffer) will be brought to the ground voltage by means of the highly-resistive pull down circuit PDWN.

It has to be noted that at the end of the data transfer from the latch 230-1 to the latch 230-2, the latch 230-1 remains unused. Thus, it can be used for performing a data load operation for the programming of the MSB, thus executing a cache program operation.

Figure 2E:
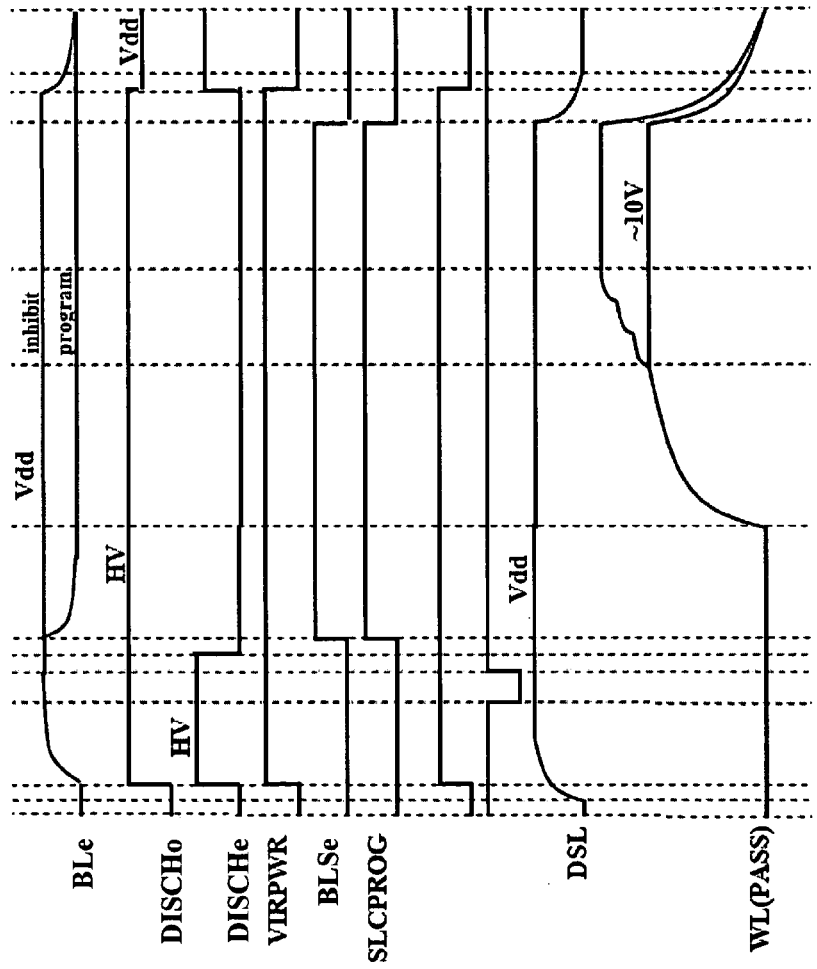
FIG. 2E illustrates a timing diagram corresponding to an LSB program operation.
Figure 2F:
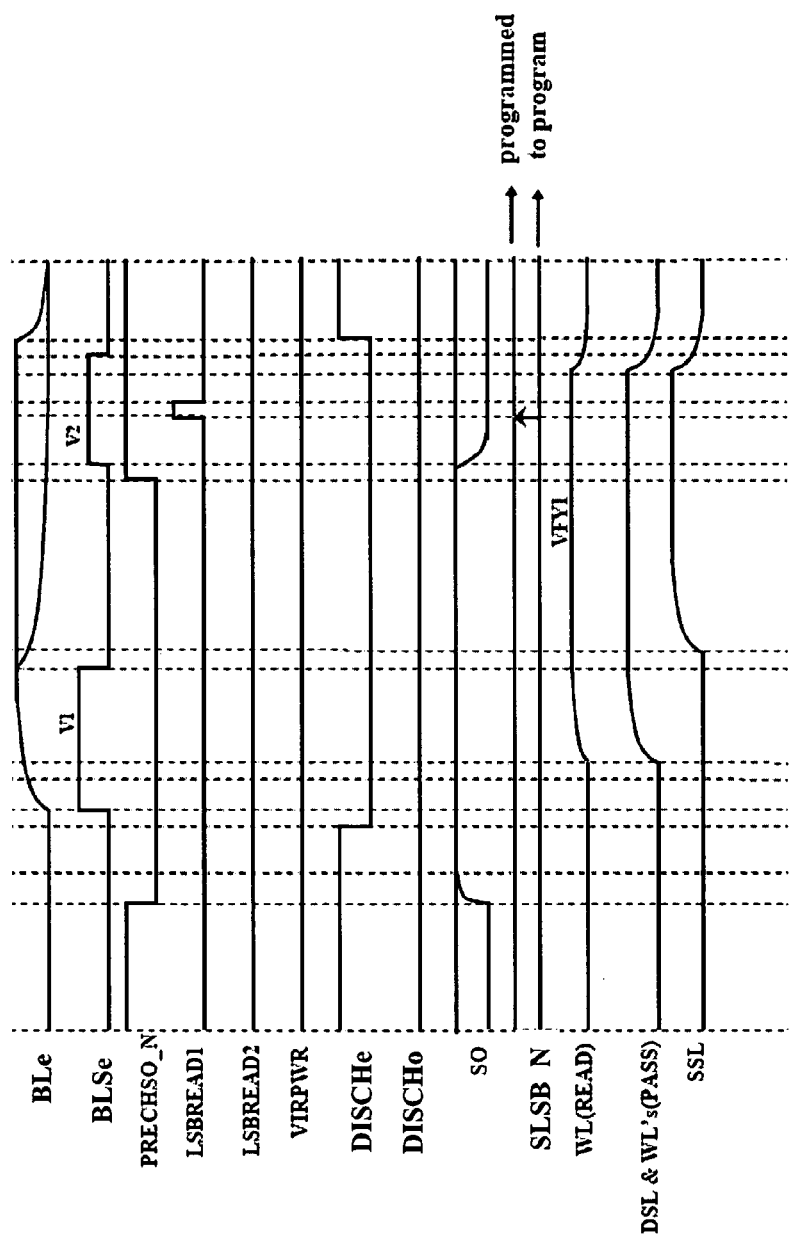
FIG. 2F illustrates a timing diagram corresponding to an LSB verify.

Referring now to FIGS. 2E and 2F, two timing diagrams showing the temporal evolutions of a plurality of signals that are involved in the memory device during an LSB program operation and an LSB verify operation are respectively illustrated.

MSB Program Operation

The first step for programming the MSB consists of storing in the read/program unit 205 the desired MSB value that has to be programmed, using the latch 230-1 (data load procedure). For this purpose, the node 237-1a is firstly brought to the ground voltage (reset operation). This is accomplished precharging the node SO to the supply voltage Vdd by means of the transistor 225 (activated by the signal PRECHSO_N), and then asserting the signal MSBREAD to the supply voltage. In this way, both the transistors 242 and 244 turn on, and the signal SMSB at the node 237-1a assumes the ground voltage.

Moreover, for performing an LSB read operation (that is necessary for getting knowledge of in which distribution the threshold voltage of the selected memory cell has to be programmed), the node 237-2b is brought to the ground voltage by asserting the signal LSBREAD2 to the supply voltage Vdd. In this way, the signal SLSB_N assumes a voltage equal to the ground voltage, and consequently, the signal SLSB at the node 237-2a assumes a voltage equal to the supply voltage Vdd.

Subsequently, a data load procedure for storing in the latch 230-1 the information that indicates which MSB value is to be programmed is performed, in an identical way as for the LSB program operation. More particularly, if the signal SMSB_N is driven to the supply voltage Vdd, it means that no further program operations are needed (MSB=1); otherwise, if the signal SMSB_N is driven to the ground voltage, it means that an MSB program operation has to be performed (MSB=0).

The LSB read operation is then performed. This LSB operation is equal to the one previously cited, and is performed exploiting the reading voltage VREAD1.

It has to be noted that, as already mentioned in the foregoing, if an MSB=1 has to be programmed, the threshold voltage of the selected cell remains in the previous LSB distribution (i.e., in the distribution 201 if LSB=1 and in the distribution 202 if LSB=0). Vice versa, if an MSB=0 has to be programmed, a memory cell whose threshold voltage belongs to the distribution 201 has to be brought to the distribution 204, while a memory cell whose threshold voltage belongs to the distribution 202 has to be brought to the distribution 203.

As in the case of the LSB program operation, the next operation consists in transferring the data stored in the latch 230-1 to the latch 230-2. This is accomplished by asserting the signals DATTRANS and LSBREAD1, in the same way as in the LSB case. It has to be noted that that if the signal SMSB_N is equal to the supply voltage, the signal SLSB_N will certainly assume the supply voltage Vdd. Contrarily, if the signal SMSB_N is equal to the ground voltage, the signal SLSB_N will maintain its previous voltage value.

After the latter phase, the node SO is precharged to the supply voltage Vdd, and the signal MLCPROG at the node 280 is asserted to the supply voltage Vdd too. In this way, the node SO is discharged to the ground voltage or not depending on the voltages of the nodes 237-1c (signal MSBREP_N, equal to the signal SMSB_N) and 237-2c (signal LSBREP_N, equal to the signal SLSB_N).

More particularly, if the signal MSBREP_N is at the supply voltage Vdd, and the signal LSBREP_N is at the supply voltage too, the transistors 272, 274, 276 and 278 are all activated, and the voltage of the node SO remains equal to the supply voltage Vdd.

If the signal MSBREP_N is at the ground voltage, and the signal LSBREP_N is at the supply voltage, the transistors 272, 274 and 276 are activated, while the transistor 278 is turned off. Consequently, the node SO is discharged to the ground voltage by means of the transistors 272 and 276.

If the signals MSBREP_N and LSBREP_N are both at the ground voltage, the transistors 272 and 274 are activated, while the transistors 276 and 278 are turned off. Consequently, the voltage of the node SO remains equal to the supply voltage Vdd.

Asserting now the signal MSBREAD to the supply voltage Vdd, the situation of the voltage values of the signals MSBREP_N (node 237-1c) and LSBREP_N (node 237-2c) will become one of the following:

case 1: if the LSB is such that the threshold voltage of the selected memory cell belongs to the distribution 201 (LSB=1), and if an MSB=1 has to be programmed, both the signals MSBREP_N and LSBREP_N will be at the supply voltage Vdd;

case 2: if the LSB is such that the threshold voltage of the selected memory cell belongs to the distribution 202 (LSB=0), and if an MSB=1 has to be programmed, both the signals MSBREP_N and LSBREP_N will be at the supply voltage Vdd;

case 3: if the LSB is such that the threshold voltage of the selected memory cell belongs to the distribution 201 (LSB=1), and if an MSB=0 has to be programmed, the signal MSBREP_N will be at the supply voltage Vdd, and the signal LSBREP_N will be at the ground voltage;

case 4: if the LSB is such that the threshold voltage of the selected memory cell belongs to the distribution 202 (LSB=0), and if an MSB=0 has to be programmed, the signal MSBREP_N will be at the ground voltage, and the signal LSBREP_N will be at the supply voltage Vdd.

It has to be noted that the case represented by both of the signals MSBREP_N and LSBREP_N at the ground voltage does not occur.

Subsequently, the selected (even) bit line BLe is precharged to the supply voltage Vdd in the same way as in the LSB program case.

Before applying to the selected word line WL the programming voltage VPROG, the signal MLCPROG is asserted again to the supply voltage Vdd, turning on the transistors 272 and 274. Thus, the selected bit line BLe discharges to the ground voltage or not depending on the voltage values of the signals MSBREP_N and LSBREP_N (it has to be remembered that if the selected bit line BLe has a voltage equal to the supply voltage Vdd, the program is inhibited). More particularly, the selected bit line BLe discharges to the ground voltage (thus allowing to program the selected memory cell) if and only if one among the signals LSBREP_N and MSBREP_N has a voltage that is equal to the ground voltage. If the signal LSBREP_N is equal to the supply voltage Vdd, the transistor 276 turns on, and discharges the bitline. Otherwise, if the signal MSBREP_N is equal to the supply voltage Vdd, the transistor 278 turns on, and discharges the bitline. If both of the signals MSBREP_N and LSBREP_N are at the supply voltage Vdd, the selected bit line remains at the supply voltage Vdd, and the selected memory cell will not be programmed.

Even in the case of MSB program, the phase wherein the selected word line WL is biased by the programming voltage is characterized by a repetition of a plurality of steps, each step including the application to the selected word line of a pulse of programming voltage VPROGR, which value increases at each step (up to a maximum value), and then the execution of a verify phase for determining if the desired threshold voltage value has been reached. More particularly, if a memory cell has to be programmed in such a way that its threshold voltage has to reach the distribution 203 (MSB=0, LSB=0), the verify will be executed using a verify reading voltage VFY2 that has a voltage value that is slightly higher then the voltage value VREAD2. Moreover, if a memory cell has to be programmed in such a way that its threshold voltage has to reach the distribution 204 (MSB=0, LSB=1), the verify will be executed using a verify reading voltage VFY3 that has a voltage value that is slightly higher then the voltage value VREAD3.

Given that the verify operation includes a read operation, and given that a single read operation needs a latch for storing the results, in this case both the latches 230-1 and 230-2 are necessary. In fact, the latch 230-1 has the function of verifying if the threshold voltage of the corresponding memory cell has reached or not the distribution 203 (MSB=0, LSB=0). For this purpose, the signal MSBREP_N will assume the supply voltage Vdd, thus inhibiting the further programming, when the threshold voltage will reach the verify reading voltage VFY2. Furthermore, the latch 230-2 has the function of verifying if the threshold voltage of the corresponding memory cell has reached or not the distribution 204 (MSB=0, LSB=1). For this purpose, the signal LSBREP_N will assume the supply voltage Vdd, thus inhibiting the further programming, when the threshold voltage will reach the verify reading voltage VFY3.

Naturally, the MSB program operation involves all the memory cells of a selected page corresponding to a particular word line WL, and the corresponding read/program units 205. The loop comprising the repetition of program operations and verify phase ends when the nodes 237-1b (corresponding to the signals MLSB_N) and 237-2b (corresponding to the signals SLSB_N) of all the read/program units 205 of the page buffer 130 assume voltage values equal to the supply voltage Vdd. At this point, all the transistors 246 and 264 will be turned off, and the voltage values of the nodes MSBVER_N and LSBVER_N will be brought to the ground voltage by means of the highly-resistive pull down circuits PDWN.

For speeding up the MSB program operation, it is possible to stop one of the two verify operations when all the cells of the selected page are verified as correctly programmed to the state corresponding to such verify operation. More particularly, the verify operation for the distribution 203 (that makes use of the verify reading voltage VFY2) stops when the signals SMSB_N of all the read/program units 205 are at the supply voltage Vdd, while the verify operation for the distribution 204 (that makes use of the verify reading voltage VFY3) stops when the signals SLSB_N of all the read/program units 205 are at the supply voltage Vdd.

It has to be noted that it is more probable that the verify operation for the distribution 203 terminates before that for the distribution 204, because the distribution 204 is characterized by threshold voltages higher than those belonging to the distribution 203 (the programming of the threshold voltage of the selected memory cell occurs by means of positive increments thereof). Consequently, after a certain time, the latch 230-1 is no more used. Thus, it is possible to perform a further data load procedure for the LSB during the MSB program operation, using the latch 230-1, thus executing a sort of cache program. Naturally, given that the read/program units 205 corresponding to memory cells 110 that have to be programmed in the distribution 204 are still performing an MSB program operation, it is necessary to selectively discharge the selected bit line before the application of the programming voltage VPROGR by activating the transistor 270 (asserting the signal SLCPROG) instead of activating the transistors 272, 274 by means of the signal MLCPROG.

Figure 2G:
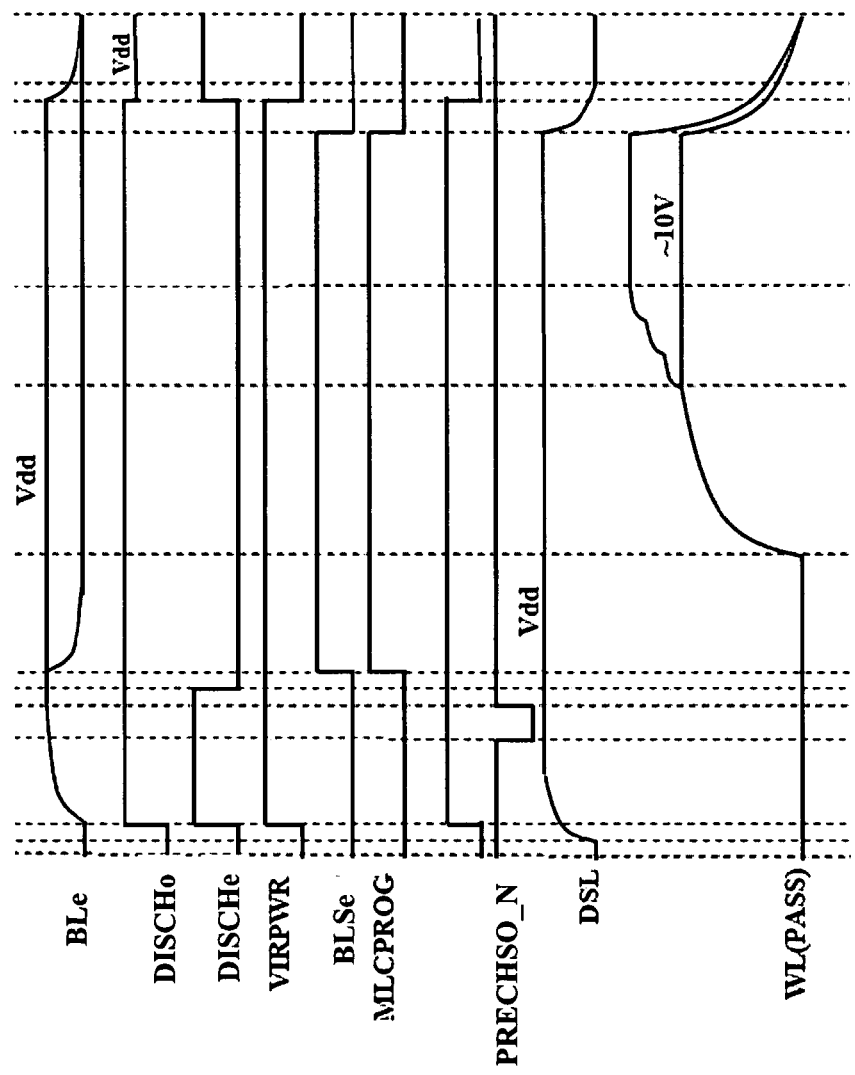
FIG. 2G illustrates a timing diagram corresponding to an MSB program operation.
Figure 2H:
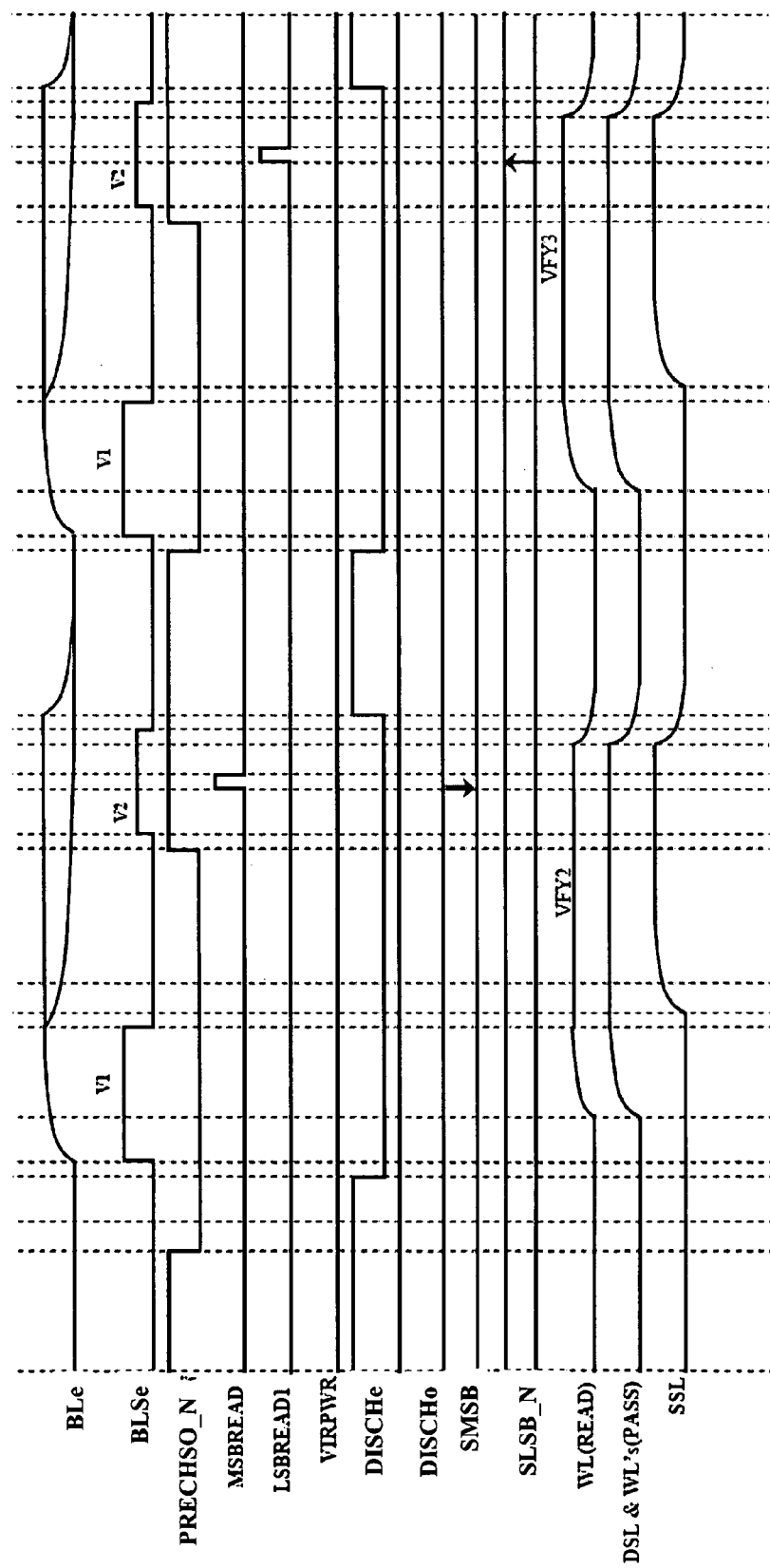
FIG. 2H illustrates a timing diagram corresponding to an MSB verify.

Referring now to FIGS. 2G and 2H, two timing diagrams showing the temporal evolutions of a plurality of signals that are involved in the memory device during an MSB program operation and an MSB verify operation are respectively illustrated.

Erase Operation

As already stated, the erase operation is necessary for bringing the threshold voltages of a block of memory cells 110 (i.e., all the memory cells corresponding to all the word lines of a stack) to the erased state, i.e., to the distribution 201. For this purpose, the semiconductor well including all the cells of the matrix 105 is biased to the erase voltage VERASE, the word lines WL corresponding to the block are biased to the ground voltage, while the remaining word lines WL of the matrix 105 are kept floating.

Firstly, it is necessary to store in the latch 230-1 an indication regarding the eventual redundancy of the corresponding bit lines. If a bit line BL is defective, it is highly probable that the memory cells 110 belonging to stacks corresponding to the bit line BL are not capable of erasing themselves. Consequently, the verify performed by the read/ program unit 205 corresponding to these bit lines do not provide in any case an affirmative result. Thus, it is necessary to force the read/program units 205 corresponding to defective bit lines in such a way to provide a correct verify result.

If a bit line is defective, the signal SMSB is driven to the ground voltage GND, in such a way to threat the corresponding memory cells 110 as erased ones (having threshold voltages belonging to the distribution 201). On the contrary, if the bit line is not defective, and it is not functionally replaced by redundant bit lines, the signal SMSB is driven to the supply voltage Vdd.

The next step consists of setting the signal SLSB_N to the supply voltage (in this phase, the latch 230-2 is used for verify the erase operation).

Once the voltage pulse having the erase voltage VERASE is applied to the semiconductor well, a verify step is performed. The verify is equal to a normal read operation, but with all the word lines WL belonging to the stack that are biased to the ground voltage. If the stack is sufficiently erased (i.e., its memory cells have their threshold voltage belonging to the distribution 201), the node SO is discharged to the ground voltage, and thus the signal SLSB_N remains at the supply voltage Vdd. Conversely, if the stack is not sufficiently erased, the node SO remains at the supply voltage Vdd, and thus, the signal SLSB_N pass to the ground voltage too, maintaining turned on the transistor 264 (erase operation not finished).

The read operations executed during the erase operation are performed using the latch 230-2. Moreover, they are carried out both on the even bit lines BLe and on the odd bit lines BLo, without setting, between the two readings, the signal SLSB_N to the supply voltage Vdd. In this way, the signal LSB_N remains at the supply voltage Vdd only if the memory cells connected to both the even and bit lines are sufficiently erased.

For controlling if the bit line corresponding to the stack is functionally replaced by a redundant bit line, it is necessary to execute a data transfer from the latch 230-1 to the latch 230-2. If the bit line is replaced by a redundant one, the node SO remains at the supply voltage Vdd, and the signal SLSB_N is brought again to the supply voltage Vdd. Conversely, if the bit line is not functionally replaced by a redundant bit line, the node SO discharge itself, and the signal SLSB_N remains as in the previous step. If the node SO remains at the ground voltage, the erase operation is failed, and the block is excluded from the matrix 105, or it is eventually functionally replaced by a redundant bit line.

The erase operation is accomplished in the correct way if all the transistors 264 of the read/program units 205 remain turned off.

Soft Compression

It has to be noted that the erased distribution 201 that is obtained with the erase operation previously described, is too wide (i.e., it is dispersive). A too wide erased distribution may increase or worsen the time duration of the subsequent program operations that involve the memory cells belonging to the erased block. For example, a memory cell having a threshold voltage that has been erased too much, necessitates more programming voltage VPROG pulses, respect to the case of a memory cell having an "average" threshold voltage.

For this purpose it is necessary to perform a Soft Compression (SOC) phase having the function to compact the erased distribution 201.

The SOC starts driving the signal SLSB to the ground voltage, as in the previous reset operations. Subsequently, a programming voltage VPROG pulse (similar to the ones previously described for the MSB and LSB program operations) is provided to all the word lines WL of the erased block. Obviously, the programming voltage VPROG used in this operation has a value that is lower than the ones used for programming the MSB and the LSB.

Subsequently, a further verify operation is performed. The further verify operation is equal to the one previously described, i.e., with the word lines WL of the block that are biased to the ground voltage. Thus, a data transfer procedure is performed, in such a way to control if the bit lines corresponding to the stack are functionally replaced by redundant bit lines (the latch 230-1 still stores the information about the redundancy, and it is not necessary to stores this information every time).

At this point, if all the transistors 264 of the read/program units 205 corresponding to the erased block are turned off (verify operation executed correctly), a further programming voltage VPROG pulse having an higher voltage respect to the ones of the preceding step is provided to all the word lines WL of the erased block.

The loop comprising the program and erase operations is performed until at least one transistor 264 is turned on.

After the SOC is performed, a further operation called Soft Erase Verify (SEV) is executed on the erased and Soft Compressed block of memory cells.

The SEV is a final verify, characterized by the fact that the word lines WL of the block are biased to a voltage that is slightly higher than the ground voltage (e.g., is equal to 0.4 Volts). In this way it is verified if the erased distribution 201 it has been compressed by the SOC in a correct way (i.e., if the distribution 201 it is not too much placed to the right in the voltages axis).

If the SEV gives a positive result (i.e., all the transistors 264 are turned off), the block is verified erased, otherwise, the block is excluded from the matrix 105.

From the previous description, it can be appreciated that during many operations performed by the page buffer 130, the circuit node SO of each read/program unit 205 is precharged to the supply voltage Vdd. The voltage value is maintained by the node SO in a floating condition, thanks to the unavoidable parasitic capacitances associated with conductive signal line (e.g., formed from a metallic layer) that physically realizes the node SO in the chip.

Figure 3A:
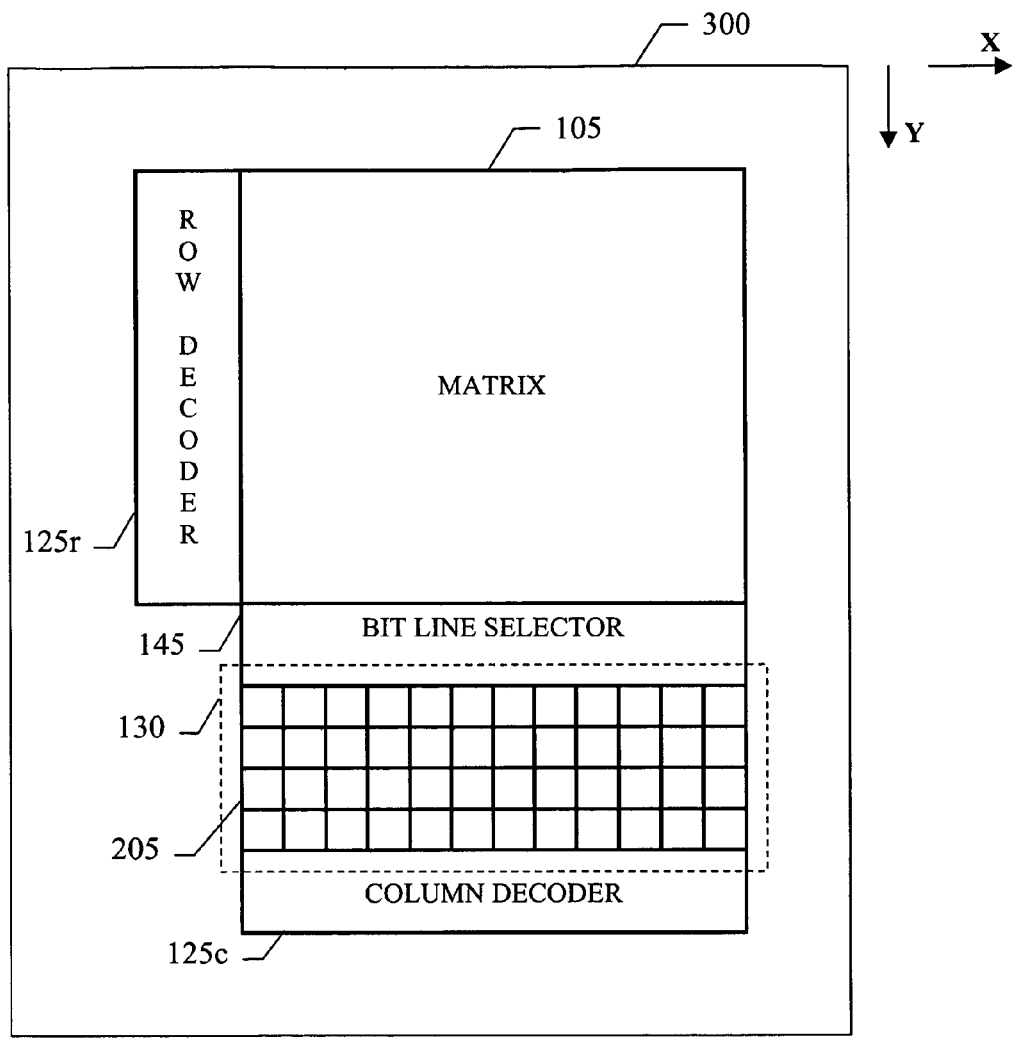
FIG. 3A is a simplified topological top plan view of the memory device of FIG. 1 according to an embodiment of the present invention.

Referring to FIG. 3A, a simplified topological top plan view of the memory device 100 is illustrated in a schematic view according to an embodiment of the present invention.

More particularly, in this figure there is depicted an exemplary arrangement of the most important circuital blocks included in the memory device 100 (and previously described) on a semiconductor chip 300. The memory matrix 105 is illustrated as a rectangular area, with the row decoder 125r positioned adjacently to the matrix left side, and the area of the bit line selector 145 that is positioned adjacently to the bottom side of the memory matrix. The page buffer 130 occupies the area placed directly under that of the bit line selector 145, and the column decoder 125c is placed directly under the page buffer 130. It has to be noted that the present description of the arrangement of the various circuital blocks included in the memory device refers to a case that is to be considered as typical for a NAND memory.

The page buffer 130 includes a plurality of read/program units 205 as previously described with reference to FIG. 2. Each unit 205 is connected to a pair of bit lines (BLe, BLo) of the memory matrix 105.

The FIG. 3A further includes, for the sake of clarity, two perpendicular arrows X, Y defining two reference directions. Particularly, the arrow X defines a horizontal direction (the direction along which the word lines extend), while the arrow Y defines a vertical direction (the direction of extension of the bit lines).

Because of space constraints, it is practically impossible to position a read/program unit 205 in the area located directly under (looking at the drawing) the space occupied by the corresponding pair of bit lines (BLe, BLo). In fact, the pitch of a pair of bit lines along the X direction is much lower than the pitch of the corresponding single read/program unit 205 (which includes several transistors). For this reason, groups of more than one read/program unit, for example four read/program units 205, are positioned in a stack along the Y direction, in the pitch of a corresponding number of (e.g. four) pairs of bit lines.

Figure 3B:
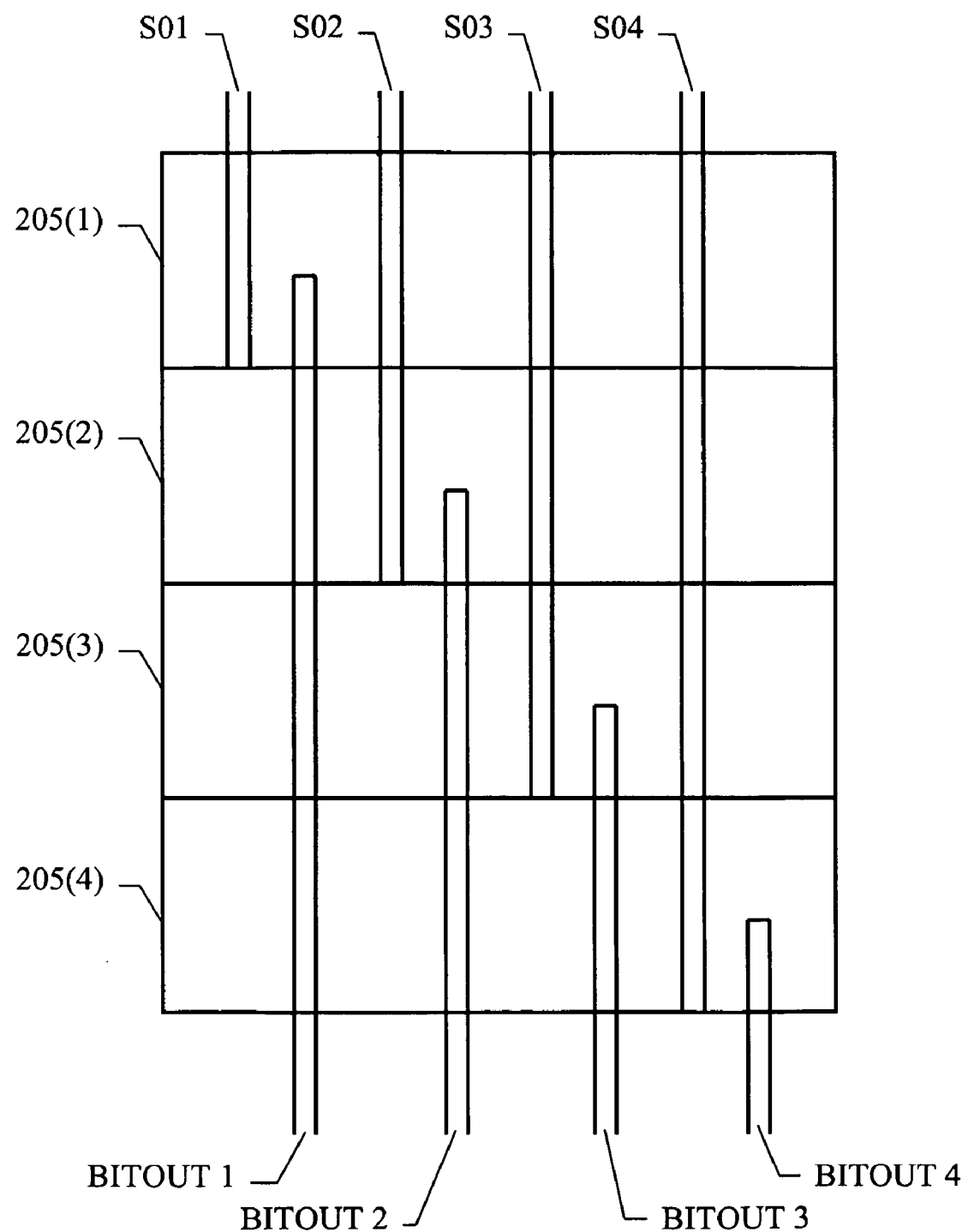
FIG. 3B illustrates a more detailed view of a stack of four read/program units in the page buffer of FIG. 1.

As illustrated in greater detail in the FIG. 3B, the coupling between each pair of bit lines and a corresponding read/program unit $205(i)$ (i=1 to 4), i.e. the circuit node SO, is accomplished by means of a respective conductive track SOi (i=1 to 4) that runs in the Y direction from the lower margin of the area of the bit line selectors 145 to the bottom of the area occupied by the corresponding read/program unit.

Furthermore, each read/program unit $205(i)$ is connected to the column decoder block 125c by means of a further conductive track BITOUTi (i=1 to 4) that runs in the Y direction from within the area occupied by the corresponding read/program unit $205(i)$ to the area occupied by the column decoder 125c.

Observing the FIG. 3B, it is possible to see that each read/program unit $205(i)$ is crossed by five conductive tracks, running in the Y direction. Defining with the term "signal levels" (SL) the number of signal conductive tracks that are encountered moving along the X direction through the area occupied by a generic read/program unit $205(i)$, SL is equal to five.

As already mentioned in the foregoing, in some operating phases of the page buffer 130, the node SO of a read/program unit $205(i)$, and thus the corresponding conductive track SOi, may have to be kept at the supply voltage Vdd in a floating condition. The floating condition is characterized by being strongly influenceable by the capacitive couplings between adjacent conductive tracks, do to the unavoidable presence of parasitic capacitances (not shown in the figure). For example, if a memory cell 110 selected for reading has been ascertained to be programmed, the node SO (and the corresponding conductive track SOi) of the associated read/program unit $205(i)$ has to remain at the supply voltage value Vdd. If the voltage values of the adjacent conductive tracks pass from the supply voltage Vdd toward the ground voltage (e.g., because the associated memory cells have been ascertained to be conductive), the voltage of the conductive track SOi in consideration will be undesirably affected, dropping by a certain (hardly predictable) amount. If the voltage decrease exceeds the trigger threshold of the latch 230-2 included in the read/program unit $205(i)$, the voltage value of the node SOi will not be able to cause the latch to switch, thus providing a wrong read operation result. It has to be noted that the conductive tracks whose voltages mainly affect the voltage value of the node SO of a generic read/program unit are the conductive tracks forming the circuit nodes SO of the remaining read/program units of the group, because they run essentially in parallel along the Y direction.

The abovementioned drawback is exacerbated by the fact that the conductive tracks SOi have associated therewith parasitic capacitances of highly different values, because of their different lengths in the Y direction.

In order to equalize the effect of parasitic capacitances on the different conductive tracks SOi of the read/program units of a group, capacitors may be deliberately provided for in the circuit design, connected to the conductive tracks SOi themselves. However, it is difficult to add capacitors having a capacitance value adapted to achieve a good capacitive matching among all the conductive tracks SOi. Moreover, adding several capacitors implies an excessive waste of silicon area.

Another solution for equalizing the parasitic capacitances of the different conductive track SOi consists of extending each conductive track SOi so that all the tracks SOi have an essentially equal length along the Y direction.

However, by extending each conductive track SOi in the Y direction so that it traverses the whole area occupied by the group of stacked read/program unit $205(i)$, the SL increases, and becomes equal to eight in the example at issue. This may pose problems in terms of space constraints. Accommodating eight conductive tracks in the pitch of eight bit lines is in fact not easy, or it may even be impractical.

Figure 4:
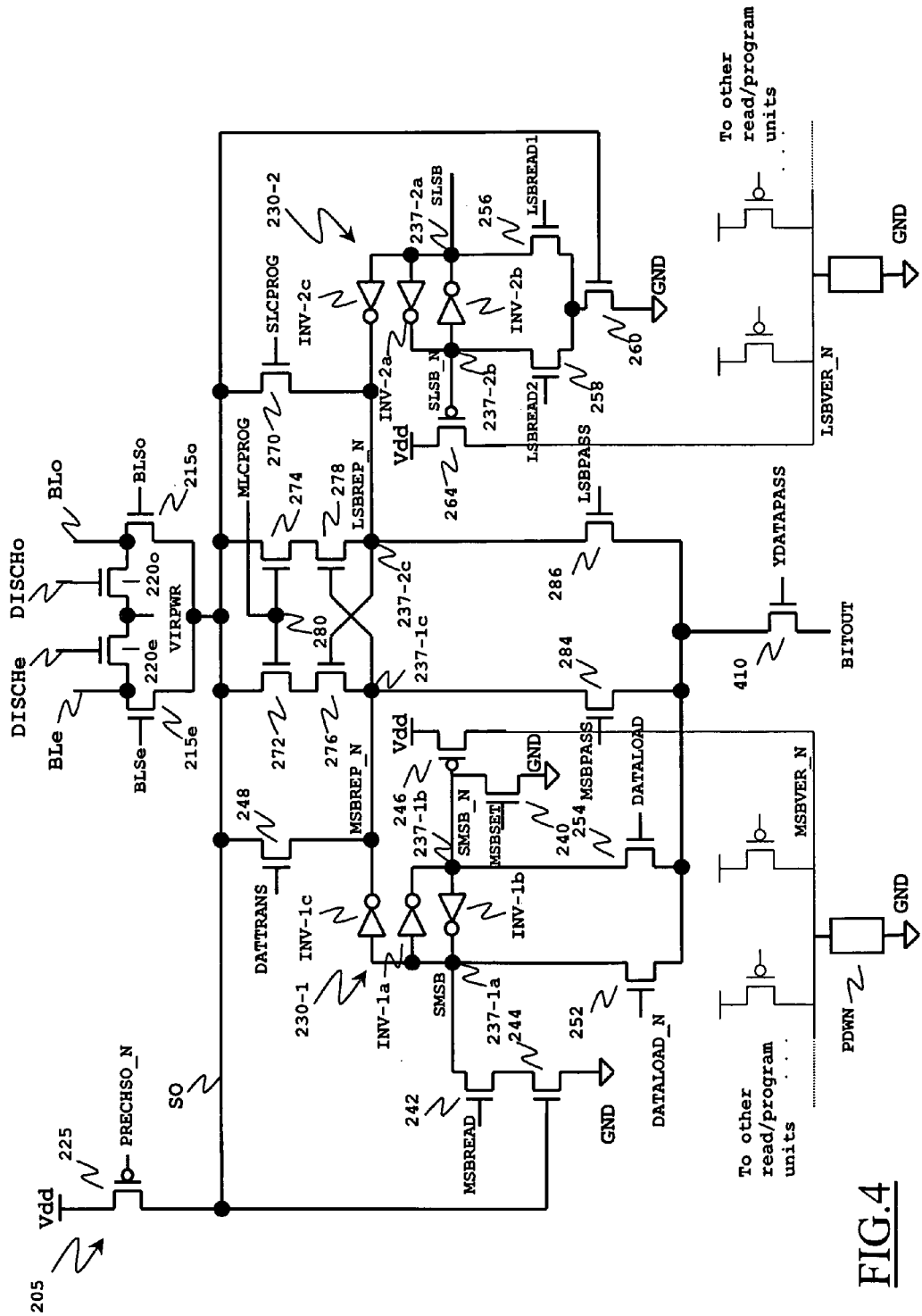
FIG. 4 illustrates the circuital view of a read/program unit included in the page buffer of the memory device of FIG. 1, according to a further embodiment of the present invention.

For extending all the conductive tracks SOi in the Y direction so that they all traverse the whole area occupied by the group of stacked read/program unit $205(i)$, without however incurring in problems related to the increase of the SL value, a possible solution consists of providing a shared single conductive track BITOUT per each stack of four read/program units $205(i)$. To accomplish this, as can be seen in FIG. 4, a column-selection N-channel transistor 410 may be introduced within the structure of the generic read/program unit 205 previously described. More particularly, the column-selection transistor 410 has the drain terminal connected to the source terminals of the transistors 252, 254, 284, 286, the gate terminal that receives a column selection signal YDATAPASS, and the source terminal that is connected to a conductive track BITOUT that is common to all the read/program units $205(i)$ belonging to the stack. During the phase in which the read/program units $205(i)$ have to output data to the column decoder, one column selection transistor 410 among the four of the four read/program units of the group is activated at a time by the column decoding signal YDATAPASS. This does not pose problems because, as previously mentioned, being many bits are read in parallel from a memory page, for example 16K, and being the read bits provided to the I/O terminals of the I/O buffers 140 in groups of $8/16$ bits in succession, it is possible to manage a sequential column decoding for the read/program units $205(i)$ belonging to a stack, thereby each read/program unit $205(i)$ is uniquely assigned the shared single conductive track BITOUT according to a time-division multiplexing scheme. It is observed that, in order to further equalize the effects of parasitic capacitances on the conductive tracks SOi of a stack of read/program units $205(i)$, it is important to consider also the physical routing of the tracks themselves.

Figure 3C:
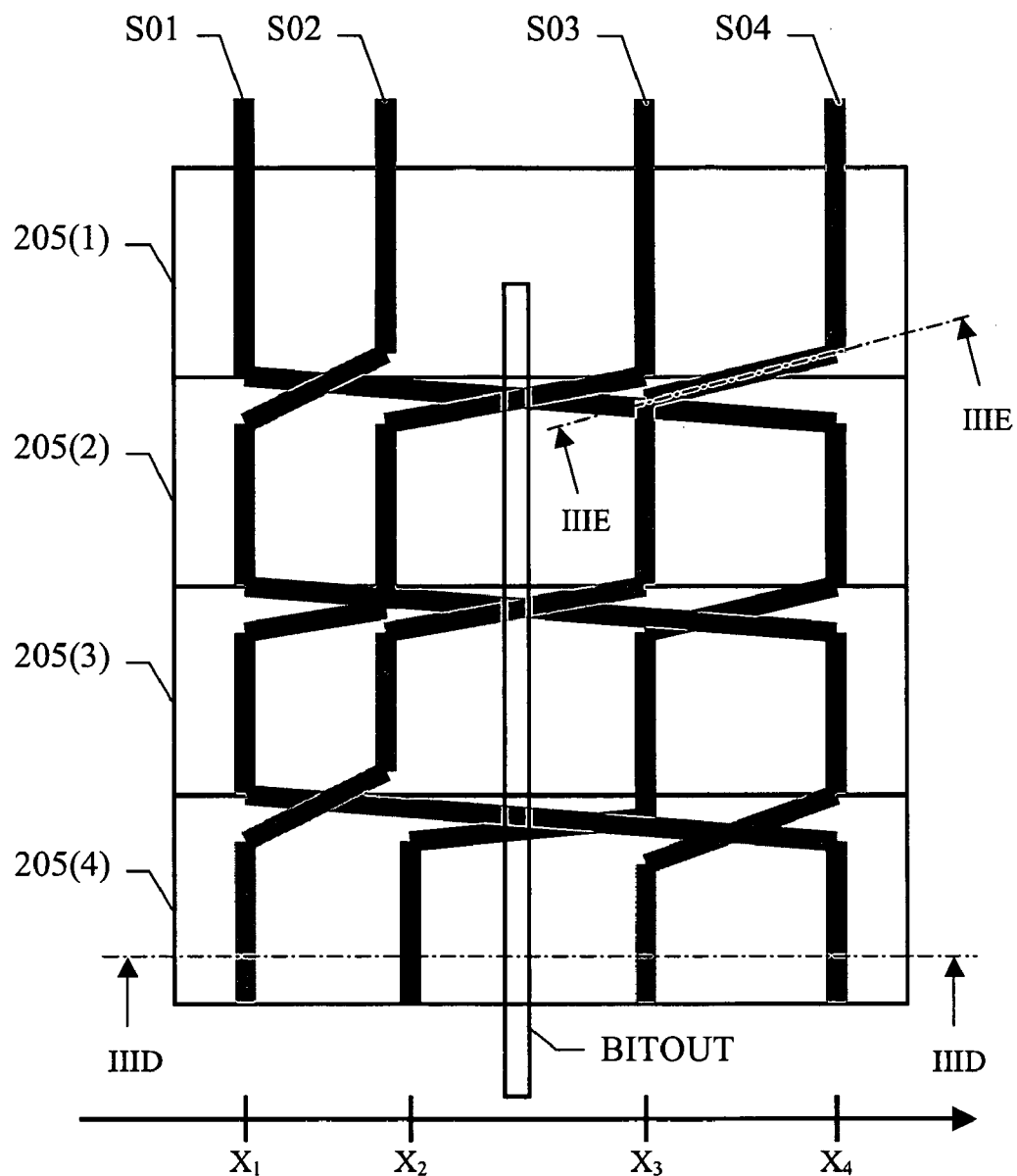
FIG. 3C illustrates a further detailed view of the stack of four read/program units according to an embodiment of the present invention.

Referring to FIG. 3C, a more detailed view of a stack of four read/program units $205(i)$, each one including a corresponding column selection transistor 410, and of the corresponding conductive tracks are illustrated according to an embodiment of the present invention.

As can be seen, each one of the four conductive tracks SOi defines a winding path running from the memory matrix 105 to the column decoder 125c, swinging in the X and Y directions, and is "twisted", or "intertwined" with the other conductive tracks SOi. More particularly, in an exemplary but not limitative embodiment of the present invention, indicating as X1, X2, X3, X4 four different positions from the left to the right along the X direction, all the conductive tracks SOi, in their path from the memory matrix 105 to the column decoder 125c, occupy all of the four positions X1, X2, X3, X4, in an essentially similar way. For example, referring to the conductive track SO1, it can be regarded as subdivided in four segments, a first segment, in correspondence of the area of the read/program unit 205(1), occupying the position X1, a second segment, connected to the first segment, in correspondence of the read/program unit 205(2), occupying the position X4, a third segment, connected to the second segment, in correspondence of the read/program unit 205(3), occupying the position X3, and a fourth segment, connected to the third segment, in correspondence of the read/program unit 205(4), occupying the position X2. Consequently, the conductive tracks SOi of a stack of read/program units exhibit essentially the same parasitic capacitances (having the same lengths), and, thanks to the "intertwined" arrangement, they experience essentially equal capacitive couplings.

Furthermore, the single conductive track BITOUT that is common to all the read/program units 205(i) belonging to a stack preferably runs in the center of the stack, between the positions X2 and X3. In this way, the structure is essentially symmetric.

For further reducing the effects of the capacitive couplings, it is possible to realize the conductive tracks SOi by means of different levels of metallic layers in correspondence to the different positions X1, X2, X3, X4 along the X direction. Consequently, it is possible to isolate almost completely each conductive track SOi from the others in the stack. For example, if the segments of tracks corresponding to the positions X1 and X4 may be formed in a first metallic layer (e.g. in metal 1), and those corresponding to the positions X2 and X3, plus the conductive track BITOUT, may be formed in a second metallic layer (e.g., metal 3, being a metallic layer patterned to define conductive tracks running essentially in the same direction as those formed from the metal 1). The nodes SO corresponding to the conductive tracks SOi are thus kept isolated during the read operations. In fact, the segments of the conductive tracks SOi that are realized in metal 3 are shielded from the conductive track BITOUT, while the capacitive couplings among metal 1 and metal 3 are negligible.

Figure 3D:
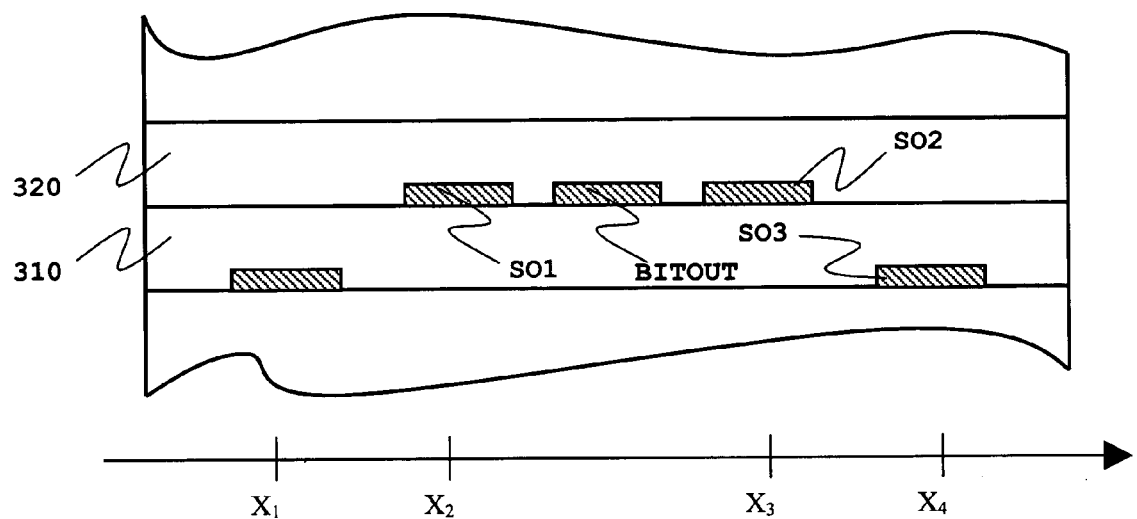
FIG. 3D illustrates a first cross-sectional view of a read/program unit of FIG. 3C.

By way of example, FIG. 3D shows a very simplified cross-sectional view of the exemplary read program unit 205(4) shown in the FIG. 3C, along the line IIID-IIID. In this section, only some elements are represented. Here, the conductive tracks SO4 (corresponding to the position X1) and SO3 (corresponding to the position X4) are photolithographically realized from a first layer of metal 310, while the conductive tracks SO1 (corresponding to the position X2), SO2 (corresponding to the position X3) and the conductive track BITOUT are photolithographically realized from a second layer of metal 320.

Figure 3E:
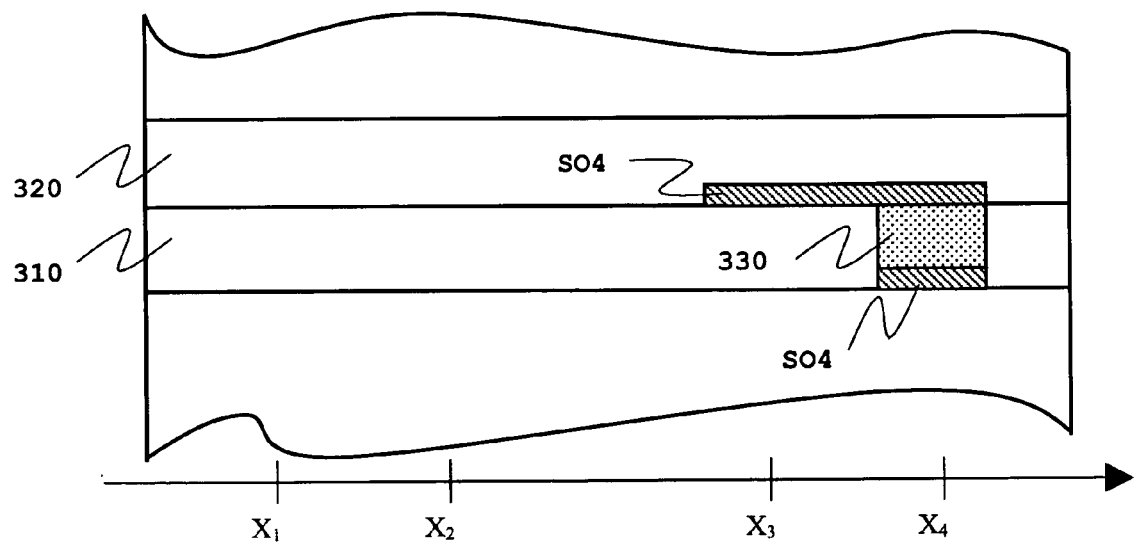
FIG. 3E illustrates a second cross-sectional view of a read/program unit of FIG. 3C.

Moreover, FIG. 3E is a very simplified cross-sectional view of a portion of read program units 205(1) and 205(2) shown in the FIG. 3C, along the line IIIE-IIIE. In this section, for the sake of simplicity, only the conductive track SO4 is illustrated. The segment of the conductive track SO4 belonging to the read/program unit 205(1) corresponds to the position X4, and thus is realized from the first layer of metal 310. The segment of the conductive track SO4 belonging to the read/program unit 205(2) corresponds to the position X3, and thus is realized from the second layer of metal 320. As can be shown from the FIG. 3E, the connection of these two segments belonging to different layers of metal is realized by means of a via 330.

Naturally, in order to satisfy local and specific requirements, a person skilled in the art may apply to the solution described above many modifications and alterations. Particularly, although the present invention has been described with a certain degree of particularity with reference to preferred embodiment(s) thereof, it should be understood that various omissions, substitutions and changes in the form and details as well as other embodiments are possible. Moreover, it is expressly intended that specific elements and/or method steps described in connection with any disclosed embodiment of the invention may be incorporated in any other embodiment as a general matter of design choice. Memory devices including embodiments of the present invention may be contained in a variety of different types of electronic devices, such as computer systems, cellular phones, personal digital assistants, digital cameras, and so on.

From the foregoing it will be appreciated that, although specific embodiments of the invention have been described herein for purposes of illustration, various modifications may be made without deviating from the spirit and scope of the invention.

The invention claimed is:

1. A page buffer for an electrically programmable memory including a plurality of memory cells arranged in a plurality of bit lines of memory cells and forming a plurality of individually-selectable memory sets, a plurality of distinct programming states defined for each memory cell, corresponding to a number N>=2 of data bits storable in each memory cell, wherein the data bits include at least a first data bits group and a second data bits group, the first data bits groups and, respectively, the second data bits groups stored in the memory cells of one of said individually-selectable memory cell sets forming at least a first memory page and a second memory page, respectively, the first and second memory pages being individually addressable in reading and writing, the page buffer comprising at least one read/program unit having a coupling line operatively associable with at least one of said bit lines and adapted to at least temporarily storing data bits read from or to be written into either one of the first or second memory page stored in the memory cells of a selected memory cells sets, the read/program unit comprising enabling means for selectively enabling a change in programming state of a selected memory cell by causing the coupling line to take one among a program enabling potential and a program inhibition potential, conditioned to:

a target data value to be stored in the first group of data bits of the selected memory cell, and an existing data value already stored in the second group of data bits of the selected memory cell;

wherein said enabling means comprise:

reading means for retrieving the existing data value;

means for receiving an indication of the target data value;

combining means for combining the received target data value with the retrieved existing data value, thereby modifying said indication of the target data value so as to obtain a modified indication; and conditioning means included in the combining means for conditioning a potential of the coupling line based on the existing data value and the modified indication, so as to cause the coupling line to take the program enabling potential or the program inhibition potential.

2. The page buffer of claim 1, wherein:
the means for receiving an indication of the target data value further include a first latch for at least temporarily store the indication of the target data value, and for providing the stored indication to a first circuit node; and
the reading means further include a second latch for at least temporarily store the existing data value retrieved from the selected memory cell, and providing it to a second circuit node.

3. The page buffer of claim 2, wherein the conditioning means included in the combining means further include:
a first transistor and a second transistor,
the first transistor having a first terminal connected to the coupling line, a control terminal connected to the control terminal of the second transistor, and a second terminal coupled to the first circuit node by means of first switch means controlled by the second circuit node;
the second transistor having a first terminal connected to the coupling line and a second terminal coupled to the second circuit node by means of second switch means controlled by the first circuit node;
the control terminal of the first and second transistors being arranged to receive a program enabling signal asserted during a program operation.

4. The page buffer of claim 3, wherein
the first switch means include a third transistor having a first terminal connected to the second terminal of the first transistor, a second terminal connected to the first circuit node, and a control terminal connected to the second circuit node, and
the second switch means include a fourth transistor having a first terminal connected to the second terminal of the second transistor, a second terminal connected to the second circuit node, and a control terminal connected to the first circuit node.

5. The page buffer of claim 4, wherein:
said plurality of distinct programming states includes four programming states, and corresponds to a number N=2 of data bits, each data bit being capable to assume a first logic value and a second logic value, the first group of data bits and the second group of data bits including each a single first and, respectively, second data bit.

6. The page buffer of claim 5, wherein said four programming states include:
a first programming state, corresponding to a first data bit having the second logic value, and to a second data bit having the second logic value;
a second programming state, corresponding to a first data bit having the second logic value, and to a second data bit having the first logic value;
a third programming state, corresponding to a first data bit having the first logic value, and to a second data bit having the first logic value; and
a fourth programming state, corresponding to a first data bit having the first logic value, and to a second data bit having the second logic value.

7. The page buffer of claim 6, wherein:
the second latch is adapted to drive the second node to a selected one among a first reference voltage or a second reference voltage in case the existing data value stored in and retrieved from the second data bit of the selected memory cell is equal to the first logic value or, respectively, to the second logic value.

8. The page buffer of claim 7, wherein:
the first latch is adapted to drive the first node to a selected one among a first reference voltage or a second reference voltage in case the target data value to be stored in the first data bit is equal to the first logic value or, respectively, to the second logic value.

9. The page buffer of claim 8, wherein:
said program enabling potential corresponds to the first reference voltage; and
said program inhibition potential corresponds to the second reference voltage.

10. The page buffer of claim 9, wherein the combining means are activated by asserting the program enabling signal to the first reference voltage, so as to modify the voltage at the first circuit node in such a way that:
if the first node and the second node are at the first reference voltage, the first node remains at the first reference voltage;
if the first node is at the second reference voltage and the second node is at the first reference voltage, the first node remains to the second reference voltage; and
if the first node and the second node are at the second reference voltage, the first node is driven to the first reference voltage.

11. The page buffer of claim 10, wherein the conditioning means are activated by asserting the program enabling signal to the first reference voltage, so as to condition the potential of the coupling line according to the following conditions:
if the first node and the second node are at the first reference voltage, the coupling line is caused to take the fist reference voltage;
if the first node is at the second reference voltage and the second node is at the first reference voltage, the coupling line is caused to take the second reference voltage; and
if the first node is at the first reference voltage, and the second node is at the second reference voltage, the coupling line is caused to take the second reference voltage.

12. A memory device including the page buffer according to claim 1.

13. A page buffer for an electrically programmable memory including a plurality of multi-level memory cells arranged in rows and columns, each memory cell in a given column being associated with a corresponding bit line, and first and second data bits stored in each memory cell being associated with first and second memory pages, the page buffer comprising:
at least one read/program unit having a node adapted to be coupled to at least one of the bit lines and operable to store data bits being read from or written to memory cells, the read/program unit including,
an enabling circuit operable to enable a change in a programming state of a selected memory cell by causing the node to store a potential corresponding to either a program enabling potential or a program inhibition potential, the potential stored on the node being a function of a target data value to be stored in the first data bit of the selected memory cell and an existing data value already stored in the data bit of the selected memory cell, the enabling circuit further comprising,
a reading circuit means for retrieving the existing data value stored in the memory cell;
a modifying circuit operable to combine the target data value with the existing data value to modify to the indication of the target data value so as to obtain a modified indication; and a conditioning circuit included in the modifying circuit for controlling a potential of the node based on the existing data value and the modified indication to drive the potential on the node to either the program enabling potential or the program inhibition potential.

14. The page buffer of claim 13 wherein the modifying circuit includes a first latch and wherein the reading circuit further includes a second latch.

15. The page buffer of claim 13 wherein each multi-level memory cell is programmable in one of four programming states and thereby stores two data bits, each data bit being capable to assume a first logic value and a second logic value.

16. The page buffer of claim 15 wherein the four programming states include:
   a first programming state, corresponding to a first data bit having the second logic value, and to a second data bit having the second logic value;
   a second programming state, corresponding to a first data bit having the second logic value, and to a second data bit having the first logic value;
   a third programming state, corresponding to a first data bit having the first logic value, and to a second data bit having the first logic value; and
   a fourth programming state, corresponding to a first data bit having the first logic value, and to a second data bit having the second logic value.

17. A memory device, comprising:
   at least one memory-cell matrix, the memory-cell matrix including a plurality of multi-level memory cells arranged in rows and columns and the memory cells being arranged in individually-selectable memory cell sets;
   an address decoder coupled to the matrix of memory cells and adapted to receive a memory address, the address decoder operable to decode the address and provide decoded row address signals to access corresponding memory cells in the array; and
   a page buffer coupled to the memory-cell matrix, each memory cell in a given column being associated with a corresponding bit line, and first and second data bits stored in each memory cell being associated with first and second memory pages, the page buffer comprising:
   at least one read/program unit having a node adapted to be coupled to at least one of the bit lines and operable to store data bits being read from or written to memory cells, the read/program unit including,
      an enabling circuit operable to enable a change in a programming state of a selected memory cell by causing the node to store a potential corresponding to either a program enabling potential or a program inhibition potential, the potential stored on the node being a function of a target data value to be stored in the first data bit of the selected memory cell and an existing data value already stored in the data bit of the selected memory cell, the enabling circuit further comprising,
      a reading circuit means for retrieving the existing data value stored in the memory cell;
      a modifying circuit operable to combine the target data value with the existing data value to modify to the indication of the target data value so as to obtain a modified indication; and
      a modifying circuit included in the modifying circuit for controlling a potential of the node based on the existing data value and the modified indication to drive the potential on the node to either the program enabling potential or the program inhibition potential.

18. The memory device of claim 17 wherein the memory device comprises a FLASH memory device.

19. The memory device of claim 17 wherein each memory cell is operable to store two data bits.

20. An electronic system, comprising:
   an electronic subsystem including a memory device, the memory device including,
   at least one memory-cell matrix, the memory-cell matrix including a plurality of multi-level memory cells arranged in rows and columns and the memory cells being arranged in individually-selectable memory cell sets;
   an address decoder coupled to the matrix of memory cells and adapted to receive a memory address, the address decoder operable to decode the address and provide decoded row address signals to access corresponding memory cells in the array; and
   a page buffer coupled to the memory-cell matrix, each memory cell in a given column being associated with a corresponding bit line, and first and second data bits stored in each memory cell being associated with first and second memory pages, the page buffer comprising:
   at least one read/program unit having a node adapted to be coupled to at least one of the bit lines and operable to store data bits being read from or written to memory cells, the read/program unit including,
      an enabling circuit operable to enable a change in a programming state of a selected memory cell by causing the node to store a potential corresponding to either a program enabling potential or a program inhibition potential, the potential stored on the node being a function of a target data value to be stored in the first data bit of the selected memory cell and an existing data value already stored in the data bit of the selected memory cell, the enabling circuit further comprising,
      a reading circuit means for retrieving the existing data value stored in the memory cell;
      a modifying circuit operable to combine the target data value with the existing data value to modify to the indication of the target data value so as to obtain a modified indication; and
      a modifying circuit included in the modifying circuit for controlling a potential of the node based on the existing data value and the modified indication to drive the potential on the node to either the program enabling potential or the program inhibition potential.

21. The electronic system of claim 20 wherein the electronic subsystem includes one of a computer system, cellular telephone, personal digital assistant, and a digital camera.

22. A method of programming data in a plurality of multi-level memory cells arranged in rows and columns, each memory cell in a given column being associated with a corresponding bit line, and first and second data bits stored in each memory cell being associated with first and second memory pages, the method comprising:
   storing data bits being read from or written to memory cells on a node;
   selectively coupling the node to the bit line of the selected memory cell;
   storing on the node either a program enabling potential or a program inhibition potential, the potential stored on the node being a function of a target data value to be stored in the first data bit of the selected memory cell and an existing data value already stored in the data bit of the selected memory cell;

retrieving the existing data value stored in the memory cell;

combining the target data value with the existing data value to modify to the indication of the target data value so as to obtain a modified indication; and controlling a potential of the node based on the existing data value and the modified indication to drive the potential on the node to either the program enabling potential or the program inhibition potential.

* * * * *